(12) United States Patent
Daitoh et al.

(10) Patent No.: US 11,695,016 B2
(45) Date of Patent: *Jul. 4, 2023

(54) ACTIVE MATRIX SUBSTRATE AND METHOD FOR MANUFACTURING SAME

(71) Applicant: Sharp Kabushiki Kaisha, Sakai (JP)

(72) Inventors: Tohru Daitoh, Sakai (JP); Masahiko Suzuki, Sakai (JP); Setsuji Nishimiya, Sakai (JP); Kengo Hara, Sakai (JP); Hitoshi Takahata, Sakai (JP); Tetsuo Kikuchi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 76 days.

This patent is subject to a terminal disclaimer.

(21) Appl. No.: 17/364,939

(22) Filed: Jul. 1, 2021

(65) Prior Publication Data
US 2022/0005839 A1   Jan. 6, 2022

(30) Foreign Application Priority Data
Jul. 6, 2020   (JP) .............................. JP2020-116271

(51) Int. Cl.
*H01L 27/12*   (2006.01)

(52) U.S. Cl.
CPC ........ *H01L 27/1225* (2013.01); *H01L 27/127* (2013.01); *H01L 27/1251* (2013.01)

(58) Field of Classification Search
CPC ....................... H01L 27/1225; H01L 27/1251; H01L 27/127
See application file for complete search history.

(56) References Cited

U.S. PATENT DOCUMENTS

| | | | |
|---|---|---|---|
| 9,202,926 B2* | 12/2015 | Kishi | H01L 21/02631 |
| 9,496,408 B2* | 11/2016 | Yamazaki | H01L 29/4908 |
| 10,269,832 B2* | 4/2019 | Hayashi | H01L 29/4908 |
| 11,069,722 B2* | 7/2021 | Matsukizono | H01L 27/1259 |

(Continued)

FOREIGN PATENT DOCUMENTS

| | | |
|---|---|---|
| JP | 2006-119404 A | 5/2006 |
| JP | 2008-225036 A | 9/2008 |

(Continued)

*Primary Examiner* — Nikolay K Yushin
(74) *Attorney, Agent, or Firm* — Keating & Bennett, LLP

(57) ABSTRACT

An active matrix substrate includes a first TFT and a second TFT, each of TFTs includes an oxide semiconductor layer and a gate electrode arranged on the oxide semiconductor layer with a gate insulating layer therebetween, in which in the first TFT, in the oxide semiconductor layer, in at least a part of a first region covered with the gate electrode with the gate insulating layer interposed therebetween, a layered structure including a high mobility oxide semiconductor film having a relatively high mobility and a low mobility oxide semiconductor film placed on the high mobility oxide semiconductor film and having a lower mobility than the high mobility oxide semiconductor film is provided, and in the second TFT, in a first region of the oxide semiconductor layer, throughout, of the high mobility oxide semiconductor film and the low mobility oxide semiconductor film, one oxide semiconductor film is provided, and the other oxide semiconductor film is not provided.

20 Claims, 49 Drawing Sheets

(56) References Cited

U.S. PATENT DOCUMENTS

| | | |
|---|---|---|
| 2008/0225024 A1 | 9/2008 | Ito |
| 2012/0138922 A1 | 6/2012 | Yamazaki et al. |
| 2013/0038518 A1 | 2/2013 | Tagawa et al. |
| 2013/0320334 A1* | 12/2013 | Yamazaki ......... H01L 21/02274 |
| | | 257/43 |
| 2014/0286076 A1 | 9/2014 | Aoki et al. |
| 2015/0076488 A1* | 3/2015 | Kishi ................. H01L 27/1225 |
| | | 257/43 |
| 2017/0090229 A1* | 3/2017 | Imai ................. H01L 29/78633 |
| 2017/0309649 A1* | 10/2017 | Hayashi ............ H01L 29/78645 |
| 2019/0280126 A1 | 9/2019 | Kikuchi et al. |
| 2020/0185379 A1* | 6/2020 | Matsukizono ...... H01L 27/1225 |
| 2022/0005838 A1* | 1/2022 | Yamanaka ........ H01L 29/78696 |

FOREIGN PATENT DOCUMENTS

| | | |
|---|---|---|
| JP | 2012-134475 A | 7/2012 |
| JP | 2014-007399 A | 1/2014 |
| JP | 2014-209727 A | 11/2014 |
| JP | 2015-109315 A | 6/2015 |
| JP | 2019-160829 A | 9/2019 |
| WO | 2011/118079 A1 | 9/2011 |
| WO | 2015/186619 A1 | 12/2015 |
| WO | WO2018/221294 * 12/2018 ........... H01L 21/326 |

* cited by examiner

ACTIVE MATRIX SUBSTRATE AND METHOD FOR MANUFACTURING SAME

CROSS-REFERENCE TO RELATED APPLICATIONS

This application claims the benefit of priority to Japanese Patent Application Number 2020-116271 filed on Jul. 6, 2020. The entire contents of the above-identified application are hereby incorporated by reference.

BACKGROUND

Technical Field

The disclosure relates to an active matrix substrate and a manufacturing method of the active matrix substrate.

An active matrix substrate used in a liquid crystal display device, an organic electroluminescence (EL) display device, or the like includes a display region including a plurality of pixels, and a region other than the display region (a non-display region or a frame region). The display region includes a switching element such as a Thin Film Transistor (hereinafter referred to as a "TFT") for each of the pixels. As such a switching element, a TFT including an amorphous silicon film serving as an active layer (hereinafter referred to as an "amorphous silicon TFT") and a TFT including a polycrystalline silicon film serving as an active layer (hereinafter referred to as a "polycrystalline silicon TFT") have been widely used.

Use of an oxide semiconductor as a material of the active layer of the TFT, in place of amorphous silicon and polycrystalline silicon has been proposed. Such a TFT is referred to as an "oxide semiconductor TFT". The oxide semiconductor has a higher mobility than amorphous silicon. Thus, the oxide semiconductor TFT can operate at a higher speed than the amorphous silicon TFT.

A structure of the TFT is roughly classified into a bottom gate structure and a top gate structure. Currently, the bottom gate structure is often adopted for the oxide semiconductor TFT, but it is also proposed to use the top gate structure (see, for example, JP 2015-109315 A). In the top gate structure, the gate insulating layer can be thinned, resulting in high current supply performance.

In the non-display region of the active matrix substrate, peripheral circuits such as a drive circuit may be monolithically (integrally) formed. By forming the drive circuit monolithically, the non-display region is narrowed and the mounting process is simplified, resulting in cost reduction. For example, in the non-display region, the gate driver circuit may be formed monolithically, and the source driver circuit may be mounted by a chip on glass (COG) process.

In devices such as smartphones, where there is a high demand for narrowing the frame, in addition to the gate driver, a demultiplexer circuit such as a source shared driving (SSD) circuit may be formed monolithically. The SSD circuit is a circuit that distributes video data from one video signal line connected to each terminal of the source driver to a plurality of source wiring lines. By mounting the SSD circuit, the region in which the terminal portions and the wiring lines are arranged in the non-display region (terminal portion and wiring line formation region) can be further narrowed. Additionally, the number of outputs from the source driver can be reduced and the circuit size can be reduced, thereby reducing the cost of the driver IC.

Peripheral circuits such as a drive circuit, an SSD circuit and the like include TFTs. In the description, a TFT arranged in each pixel in the display region as a switching element is referred to as a "pixel TFT" or "pixel transistor", and a TFT configuring the peripheral circuit is referred to as a "circuit TFT" or "circuit transistor". Further, among the circuit TFTs, a TFT configuring the drive circuit is referred to as a "drive circuit TFT", and a TFT configuring the SSD circuit is referred to as an "SSD circuit TFT".

In an active matrix substrate using an oxide semiconductor TFT as the pixel TFT, from the perspective of the manufacturing process, it is preferable that the circuit TFT be also formed by using the same oxide semiconductor film as the pixel TFT and by using a common process. Therefore, the circuit TFT and the pixel TFT usually have the same structure. The characteristics of these TFTs are also substantially the same.

SUMMARY

However, the characteristics required for the pixel TFT and the circuit TFT are different from each other. Further, among the circuit TFTs, for example, the drive circuit TFT and the SSD circuit TFT have different required characteristics. In recent years, the types of peripheral circuits formed monolithically in the active matrix substrate have been increasing, which further diversifies the performance required for the circuit TFTs.

Further, in an organic EL display device, a pixel circuit including at least two types of pixel TFTs (referred to as a "drive TFT" and a "selection TFT") and a capacitance element is provided in one pixel. The selection TFT has a function of selecting a pixel by changing the voltage applied to the drive TFT. The drive TFT functions to supply a current required for light emission. Since the selection TFT and the drive TFT have different functions, the characteristics required for the selection TFT and the drive TFT may also be different.

As described above, in an active matrix substrate provided with a plurality of TFTs having different uses, it is necessary to separately produce a plurality of oxide semiconductor TFTs having different characteristics so that each TFT can have the required characteristics according to the use.

An embodiment of the present disclosure has been conceived in light of the above-described circumstances, and an object of the present disclosure is to provide an active matrix substrate having a top gate structure and including a plurality of oxide semiconductor TFTs having different characteristics from one another.

An active matrix substrate and a manufacturing method of an active matrix substrate are disclosed herein in the following items.

Item 1

An active matrix substrate having a display region including a plurality of pixel areas and a non-display region arranged around the display region, the active matrix substrate including a substrate, and a plurality of oxide semiconductor TFTs supported on the substrate and provided in the display region or the non-display region, each of the plurality of oxide semiconductor TFTs includes an oxide semiconductor layer and a gate electrode arranged on a part of the oxide semiconductor layer with a gate insulating layer interposed between the oxide semiconductor layer and the gate electrode, in which the oxide semiconductor layer has a first region covered with the gate electrode with the gate insulating layer interposed between the oxide semiconductor layer and the gate electrode, a first TFT and a second TFT are included in the plurality of oxide semiconductor TFTs, in the first TFT, in at least a part of the first region of the oxide semiconductor layer, a layered structure including a high mobility oxide semiconductor film having a relatively high mobility and a low mobility oxide semiconductor film arranged on the high mobility oxide semiconductor film and having a relatively lower mobility than the high mobility oxide semiconductor film is provided, and in the second TFT, in the first region of the oxide semiconductor layer, throughout, of the high mobility oxide semiconductor film and the low mobility oxide semiconductor film, one oxide semiconductor film is provided and another oxide semiconductor film is not provided.

Item 2

The active matrix substrate according to item 1, in which in the first region in the second TFT, the low mobility oxide semiconductor film is provided and the high mobility oxide semiconductor film is not provided.

Item 3

The active matrix substrate according to item 1, in which in the first region in the second TFT, the high mobility oxide semiconductor film is provided and the low mobility oxide semiconductor film is not provided.

Item 4

The active matrix substrate according to any one of items 1 to 3, in which each of the plurality of oxide semiconductor TFTs further includes a source electrode and a drain electrode, and the oxide semiconductor layer of each of the plurality of oxide semiconductor TFTs has a first contact region and a second contact region located on both sides of the first region, the first contact region is electrically connected to the source electrode, and the second contact region is electrically connected to the drain electrode.

Item 5

The active matrix substrate according to item 4, in which in the first TFT, in the at least a part of the first region, the layered structure is provided, but in the first contact region and the second contact region, the low mobility oxide semiconductor film is provided and the high mobility oxide semiconductor film is not provided.

Item 6

The active matrix substrate according to item 5, in which in the first TFT, in the entire first region of the oxide semiconductor layer, the layered structure is provided.

Item 7

The active matrix substrate according to item 5, in which in the first TFT, in a part of the first region of the oxide semiconductor layer, the layered structure is provided, and in another part, the low mobility oxide semiconductor film is provided and the high mobility oxide semiconductor film is not provided.

Item 8

The active matrix substrate according to any one of items 4 to 7, the active matrix substrate further including an interlayer insulating layer covering the gate electrodes, the gate insulating layers, and the oxide semiconductor layers, in the plurality of oxide semiconductor TFTs, in which the source electrode and the drain electrode in each of the first TFT and the second TFT are arranged on the interlayer insulating layer.

Item 9

The active matrix substrate according to any one of items 4 to 7, in which at least one electrode of the source electrode and the drain electrode of the second TFT is arranged on the substrate side of the oxide semiconductor layer of the second TFT with a lower insulating layer interposed between the at least one electrode and the oxide semiconductor layer, in the first region of the second TFT, the low mobility oxide semiconductor film is provided and the high mobility oxide semiconductor film is not provided, and in at least one of the first contact region and the second contact region in the second TFT, a layered structure including the low mobility oxide semiconductor film and a connection layer made of the high mobility oxide semiconductor film is provided, and the connection layer is electrically connected to the at least one electrode in an opening in the lower insulating layer.

Item 10

The active matrix substrate according to item 9, the active matrix substrate further including a plurality of pixel TFTs each arranged in the plurality of pixel areas, in which each of the plurality of pixel TFTs is the second TFT, the at least one electrode is the source electrode of the second TFT, and the drain electrode of the second TFT is arranged above the oxide semiconductor layer of the second TFT.

Item 11

The active matrix substrate according to any one of items 4 to 10, in which a third TFT is further included in the plurality of oxide semiconductor TFTs, in the first TFT, in each of the first region, the first contact region, and the second contact region, the layered structure is provided, and in the third TFT, in the at least a part of the first region, the layered structure is provided, but in each of the first contact region and the second contact region, the low mobility oxide semiconductor film is provided and the high mobility oxide semiconductor film is not provided.

Item 12

The active matrix substrate according to item 2, in the first region of the oxide semiconductor layer of the first TFT, another oxide semiconductor film having a lower mobility than the high mobility oxide semiconductor film between the high mobility oxide semiconductor film and the substrate is further provided, and in the first region of the second TFT, the other oxide semiconductor film is not provided.

Item 13

The active matrix substrate according to item 3, in which in each of the first regions of the oxide semiconductor layers of the first TFT and the second TFT, another oxide semiconductor film having a lower mobility than the high mobility oxide semiconductor film between the high mobility oxide semiconductor film and the substrate is further provided.

Item 14

The active matrix substrate according to item 2, the active matrix substrate further including a plurality of pixel TFTs each arranged in the plurality of pixel areas and a peripheral circuit arranged in the non-display region, in which the peripheral circuit includes the first TFT, and each of the plurality of pixel TFTs is the second TFT.

Item 15

The active matrix substrate according to item 2, the active matrix substrate further including a gate drive circuit and an SSD circuit arranged in the non-display region, in which the SSD circuit includes the first TFT, and the gate drive circuit includes the second TFT.

Item 16

The active matrix substrate according to item 2, in which in each of the plurality of pixel areas, a pixel circuit including a selection TFT, a drive TFT, and a capacitance element is provided, the selection TFT is the first TFT, and the drive TFT is the second TFT.

Item 17

The active matrix substrate according to item 2, the active matrix substrate further including a plurality of pixel circuits, each of the plurality of pixel circuits is arranged in each of the plurality of pixel areas and includes a selection TFT, a drive TFT, and a capacitance element, and a gate drive circuit arranged in the non-display region, in which the gate drive circuit includes the first TFT, and the drive TFT is the second TFT.

Item 18

The active matrix substrate according to any one of items 1 to 17, in which each of the low mobility oxide semiconductor film and the high mobility oxide semiconductor film contains In and/or Sn, and a sum of atomic ratios of In and Sn to all metal elements in the high mobility oxide semiconductor film is larger than a sum of atomic ratios of In and Sn to all metal elements in the low mobility oxide semiconductor film.

Item 19

The active matrix substrate according to any one of items 1 to 17, in which the high mobility oxide semiconductor film contains Sn, and the low mobility oxide semiconductor film does not contain Sn or contains Sn at a lower concentration than the high mobility oxide semiconductor film.

Item 20

A manufacturing method of an active matrix substrate including a substrate and a plurality of oxide semiconductor TFTs supported on the substrate, a first TFT formed in a first TFT formation region and a second TFT formed in a second TFT formation region are included in the plurality of oxide semiconductor TFTs, the manufacturing method including (A) a step of forming a high mobility oxide semiconductor film on a substrate in both of the first TFT formation region and the second TFT formation region, (B) a step of removing at least a part of the high mobility oxide semiconductor film located in the second TFT formation region by patterning the high mobility oxide semiconductor film, (C) after the step (B), a step of forming a low mobility oxide semiconductor film having a lower mobility than the high mobility oxide semiconductor film so as to cover the high mobility oxide semiconductor film in both of the first TFT formation region and the second TFT formation region, (D) a step of forming a first oxide semiconductor layer including a layered portion including the high mobility oxide semiconductor film and the low mobility oxide semiconductor film in the first TFT formation region and forming a second oxide semiconductor layer including a first portion including the low mobility oxide semiconductor film and not including the high mobility oxide semiconductor film in the second TFT formation region by patterning the low mobility oxide semiconductor film, or patterning the high mobility oxide semiconductor film and the low mobility oxide semiconductor film, and (E) a step of forming a gate insulating layer and gate electrode, in which the gate electrode is arranged on at least a part of the layered portion of the first oxide semiconductor layer with the gate insulating layer interposed between the at least a part of the layered portion and the gate electrode in the first TFT formation region, and the gate electrode is arranged on the first portion of the second oxide semiconductor layer with the gate insulating layer interposed between the first portion and the gate electrode in the second TFT formation region.

Item 21

The active matrix substrate according to any one of items 1 to 17, in which each of the low mobility oxide semiconductor film and the high mobility oxide semiconductor film contains an In—Ga—Zn—O based semiconductor, and an atomic ratio of In to all metal elements in the high mobility oxide semiconductor film is larger than an atomic ratio of In to all metal elements in the low mobility oxide semiconductor film.

Item 22

The active matrix substrate according to item 21, in which the In—Ga—Zn—O based semiconductor in the low mobility oxide semiconductor film and/or the high mobility oxide semiconductor film contains a crystalline portion.

Item 23

The manufacturing method of the active matrix substrate according to item 20, in which in the step (D), in the first TFT formation region, the first oxide semiconductor layer further including an upper layer portion including the low mobility oxide semiconductor film and not including the high mobility oxide semiconductor film on both sides of the layered portion is formed, the manufacturing method further including a step of forming a source electrode and a drain electrode, each of the source electrode and the drain electrode is electrically connected to the upper layer portion of the first oxide semiconductor layer in the first TFT formation region.

Item 24

The manufacturing method of the active matrix substrate according to item 20, the manufacturing method further including, prior to the step (A), a step of forming a source electrode on the substrate in the second TFT formation region, a step of forming a lower insulating layer covering the source electrode in the first TFT formation region and the second TFT formation region, and a step of forming an opening in the lower insulating layer that exposes a part of the source electrode in the second TFT formation region, in which the step (B) includes a step of forming a connection layer made of the high mobility oxide semiconductor film and in contact with the source electrode in the opening in the second TFT formation region, and the second oxide semiconductor layer includes the connection layer and the low mobility oxide semiconductor film covering the connection layer.

According to an embodiment of the disclosure, an active matrix substrate having a top gate structure and including a plurality of oxide semiconductor TFTs having different characteristics is provided. Further, according to an embodiment of the disclosure, provided is a manufacturing method of an active matrix substrate capable of producing a plurality of oxide semiconductor TFTs having different characteristics by using the same oxide semiconductor film.

BRIEF DESCRIPTION OF DRAWINGS

The disclosure will be described with reference to the accompanying drawings, wherein like numbers reference like elements.

DESCRIPTION OF EMBODIMENTS

Figure 1:
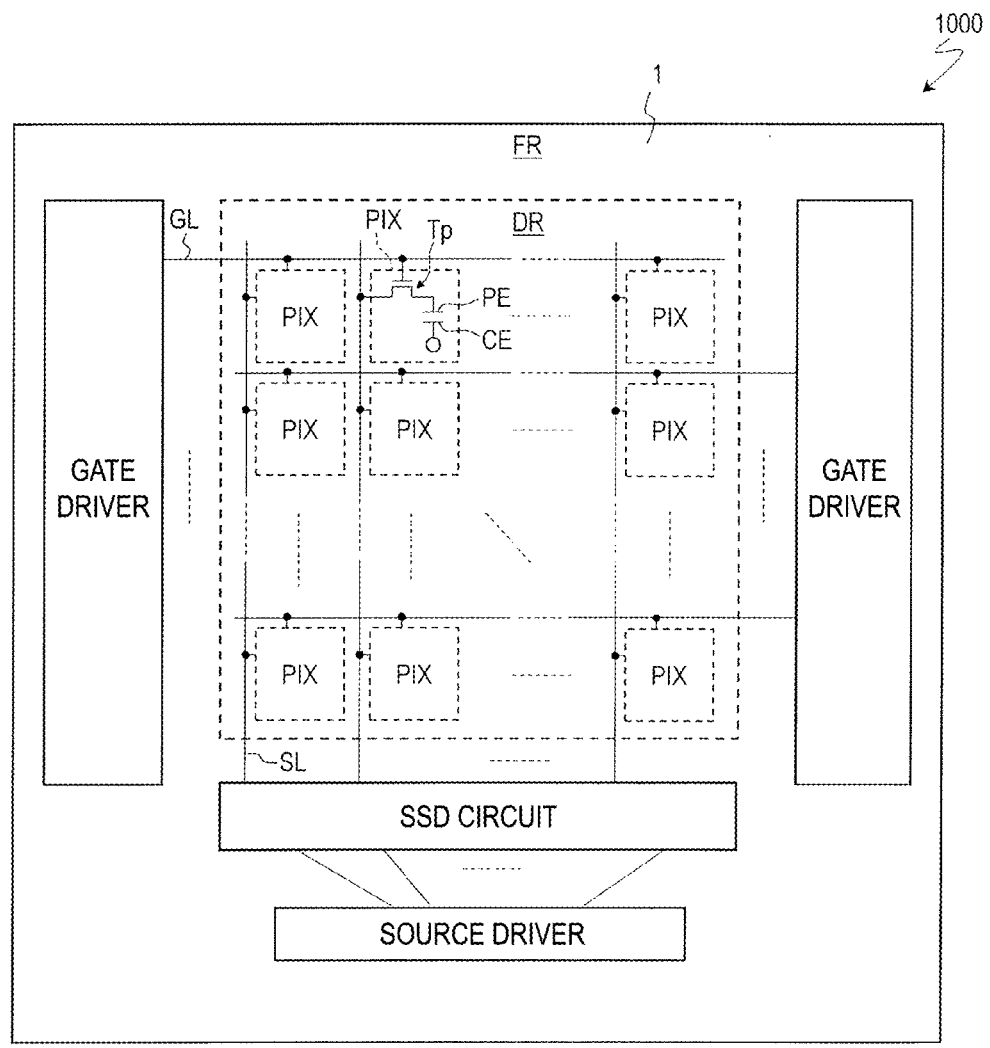
FIG. 1 is a schematic diagram illustrating an example of a planar structure of an active matrix substrate 1000 according to a first embodiment.

As described above, the TFTs provided in the active matrix substrate have different required characteristics depending on the respective uses. Hereinafter, an example of suitable TFT characteristics will be described using an active matrix substrate used in a liquid crystal display device as an example.

An SSD circuit TFT used in an SSD circuit is required to flow a relatively large on current and have a large current driving force. With a TFT having a small current driving force, it may be difficult to charge the source bus line at a predetermined time. On the other hand, when the channel width of the TFT is increased in order to ensure the desired current driving force, the size of the TFT may increase, and the frame narrowing may not be achieved. Therefore, in the SSD circuit TFT, it is preferable to lower the threshold voltage to further increase the on current. The SSD circuit TFT may have, for example, depletion characteristics of having a negative threshold voltage.

In contrast, in a drive circuit TFT used in a drive circuit such as a gate driver, it is preferable that the threshold voltage be shifted in a positive direction from the threshold voltage of the SSD circuit TFT to reduce the off-leak current. A large off-leak current may result in increased power consumption, operation failure or malfunction of the drive circuit, or the like. The drive circuit TFT may have, for example, enhancement characteristics of having a positive threshold voltage.

Additionally, a TFT having a small off-leak current is preferably used as a pixel TFT used in a liquid crystal display device. The pixel TFT may have depletion characteristics or enhancement characteristics.

Further, in the active matrix substrate used in an organic EL display device, a pixel circuit including at least a drive TFT and a selection TFT is provided in one pixel. The drive TFT preferably has enhancement characteristics. Further, in order to suitably perform multi-gray scale display, it is preferable that the Vg-Id (Vg represents a gate voltage and Id represents a drain current) characteristic of the drive TFT be gentle (that is, not steep) to some extent. Therefore, the drive TFT is required to have a large subthreshold coefficient (S value). In order to increase the threshold voltage in the positive direction and increase the S value, for example, an oxide semiconductor with a low mobility may be used. On the other hand, the selection TFT preferably has a high mobility (i.e., a large on current). The threshold voltage of the selection TFT may be negative (depression characteristics). Further, the selection TFT may not be required to have the large S value. Rather, the selection TFT is required to have a small S value and a high switching speed.

Note that the uses and required characteristics of the TFT are not limited to the examples described above, and diversify.

However, it is difficult to form a plurality of TFTs with different characteristics by using the same oxide semiconductor film. For example, it is preferable to use an oxide semiconductor having a high mobility for the SSD circuit TFT and the pixel TFT, but when the mobility of the oxide semiconductor increases, the threshold voltage of the TFT shifts in a negative direction, resulting in depletion characteristics. Therefore, the oxide semiconductor having the high mobility may not be suitable for the drive circuit TFT. On the other hand, in order to obtain enhancement characteristics, an oxide semiconductor having a relatively low mobility is preferably used for the drive circuit TFT. However, since it is difficult to further increase the on current with the TFT having enhancement characteristics, it may not be suitable for other peripheral circuits such as, for example, the SSD circuit.

Based on the above knowledge, the present inventors have found a method for producing a plurality of top gate TFTs using the same oxide semiconductor film and having different characteristics from one another.

First Embodiment

Hereinafter, an active matrix substrate according to a first embodiment will be described with reference to the drawings, using an active matrix substrate used in a liquid crystal display device as an example.

Basic Configuration of Active Matrix Substrate 1000

FIG. 1 is a schematic diagram illustrating an example of a planar structure of an active matrix substrate 1000 according to the present embodiment.

The active matrix substrate 1000 has a display region DR, and a region (a non-display region or a frame region) FR other than the display region DR. The display region DR is constituted of a plurality of pixel areas PIX arranged in a matrix shape. Each of the plurality of pixel areas PIX (also referred to as a "pixel") is an area corresponding to a pixel of the display device. The non-display region FR is a region positioned in a periphery of the display region DR and does not contribute to display.

In the non-display region FR, for example, a gate driver, a demultiplexer circuit functioning as an SSD circuit, and the like are integrally (monolithically) provided. A source driver is mounted on the active matrix substrate 1000, for example.

In the display region DR, a plurality of gate bus lines GL extending in a row direction (x direction), and a plurality of source bus lines SL extending in a column direction (y direction) are formed. Each of the plurality of pixel areas PIX is defined by the gate bus line GL and the source bus line SL, for example. The gate bus lines GL are connected to respective terminals of the gate driver. The source bus lines SL are connected to respective terminals of the source driver.

Each of the plurality of pixel areas PIX includes a pixel transistor (pixel TFT) Tp and a pixel electrode PE. A gate electrode of the pixel transistor Tp is electrically connected to the corresponding gate bus line GL, and a source electrode of the thin film transistor Tp is electrically connected to the corresponding source bus line SL. A drain electrode of the thin film transistor Tp is electrically connected to the pixel electrode PE. When the active matrix substrate 1000 is applied to a display device in a transverse electrical field mode such as a fringe field switching (FFS) mode, although not illustrated, the active matrix substrate 1000 is provided with an electrode common to the plurality of pixels (common electrode).

A plurality of circuit TFTs configuring the peripheral circuits are formed in the non-display region of the active matrix substrate 1000. The circuit TFT includes a drive circuit TFT configuring the gate driver, an SSD circuit TFT configuring the SSD circuit, and the like.

TFT Structure in Active Matrix Substrate 1000

Next, the structures of the plurality of top gate TFTs included in the active matrix substrate 1000 will be described.

The characteristics of the top gate TFT in which the oxide semiconductor layer is the active layer may change depending on the structure of, in the oxide semiconductor layer, the region covered with the gate electrode with the gate insulating layer interposed therebetween, for example. In the description, in the oxide semiconductor layer, the region covered with the gate electrode with the gate insulating layer interposed therebetween is referred to as a "first region". The first region includes a region where a channel is formed. Further, the structure in the first region in the oxide semiconductor layer may be referred to as an "active layer structure".

In the present embodiment, the active matrix substrate 1000 includes a plurality of oxide semiconductor TFTs having a top gate structure. At least one first TFT and one second TFT having different active layer structures from each other are included in the plurality of oxide semiconductor TFTs. The active layers of the first TFT and the second TFT are formed by using the same oxide semiconductor film (here, a high mobility oxide semiconductor film).

In the first TFT, in at least a part of the first region of the oxide semiconductor layer, a layered structure including the high mobility oxide semiconductor film and the low mobility oxide semiconductor film arranged on the high mobility oxide semiconductor film is provided. The term "high mobility oxide semiconductor film" refers to an oxide semiconductor film having a relatively high mobility, and "low mobility oxide semiconductor film" refers to an oxide semiconductor film having a relatively low mobility (that is, lower than the high mobility oxide semiconductor film). On the other hand, in the second TFT, in the entire first region of the oxide semiconductor layer, one of the high mobility oxide semiconductor film and the low mobility oxide semiconductor film described above is provided, and another is not provided.

The first TFT and the second TFT may have different characteristics because the first TFT and the second TFT have different active layer structures from each other. For example, since the mobility in the first region of the second TFT is lower than that of the first TFT, the second TFT may have a threshold voltage obtained by shifting the threshold voltage of the first TFT in the positive direction.

In the description, in the oxide semiconductor layer, a portion having the layered structure including the high mobility oxide semiconductor film and the low mobility oxide semiconductor film is referred to as a "layered portion pa". In addition, in the oxide semiconductor layer, a portion including the high mobility oxide semiconductor film and not including the low mobility oxide semiconductor film is referred to as a "lower layer portion p1" and a portion including the low mobility oxide semiconductor film and not including the high mobility oxide semiconductor film is referred to as an "upper layer portion p2". The lower layer portion p1 may have a single-layer structure including only the high mobility oxide semiconductor film, or may further include another semiconductor film. Similarly, the upper layer portion p2 may only include the low mobility oxide semiconductor film, or may further include another semiconductor film.

Hereinafter, the structure of each TFT will be described more specifically with reference to the drawings.

Figure 2:
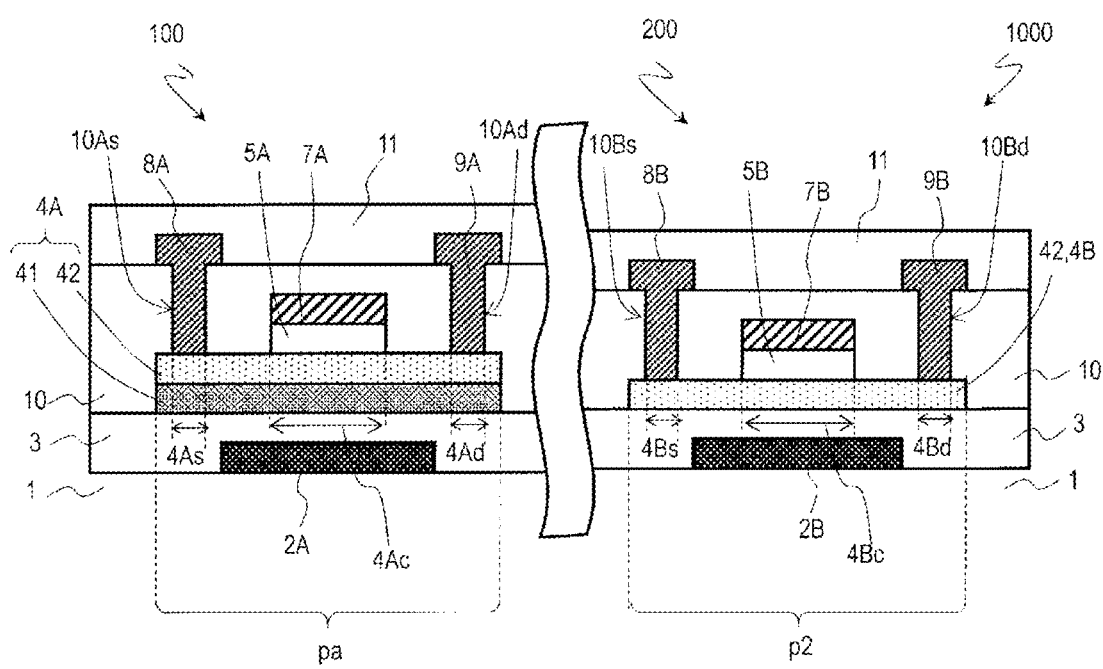
FIG. 2 is a cross-sectional view illustrating a first TFT 100 and a second TFT 200 formed in the active matrix substrate 1000.

FIG. 2 is a cross-sectional view illustrating a first TFT 100 and a second TFT 200 formed in the active matrix substrate 1000. Here, an example will be described in which the TFT 100 is used as some circuit TFTs (for example, an SSD circuit TFT) that require current driving force, and the TFT 200 is used as a pixel TFT or a drive circuit TFT. The active matrix substrate 1000 may have a plurality of TFTs 100 and a plurality of TFTs 200, but only a single TFT 100 and a single TFT 200 will be illustrated and described.

The TFTs 100 and 200 are top gate TFTs supported on the substrate 1 and have an active layer including an oxide semiconductor film.

The TFT 100 includes an oxide semiconductor layer 4A arranged on the substrate 1, a gate insulating layer 5A covering the oxide semiconductor layer 4A, a gate electrode 7A arranged on the gate insulating layer 5A, and a source electrode 8A and a drain electrode 9A. The gate electrode 7A is arranged so as to cover a part of the oxide semiconductor layer 4A with the gate insulating layer 5A interposed therebetween.

The oxide semiconductor layer 4A has a first region 4Ac covered with the gate electrode 7A with the gate insulating layer 5A interposed therebetween, and a region not covered with the gate electrode 7A when viewed from a normal direction of the substrate 1 (hereinafter, referred to as a "second region").

In the entire first region 4Ac of the oxide semiconductor layer 4A, a layered portion pa having a layered structure including a high mobility oxide semiconductor film 41 and a low mobility oxide semiconductor film 42 arranged on the high mobility oxide semiconductor film 41 is provided.

The second region of the oxide semiconductor layer 4A may be a low-resistance region having a lower specific resistance than the first region 4Ac. The low-resistance region can be formed, for example, by subjecting the oxide semiconductor layer 4A to processing for lowering the resistance using the gate electrode 7A as a mask.

The second region (low-resistance region) has a first contact region 4As and a second contact region 4Ad so as to be located on both sides of the first region 4Ac respectively when viewed from the normal direction of the substrate 1. The first contact region 4As is a region electrically connected to the source electrode 8A, and the second contact region 4Ad is a region electrically connected to the drain electrode 9A. In the first contact region 4As and the second contact region 4Ad, the layered portion pa may also be provided. For example, as illustrated in the figure, the entire oxide semiconductor layer 4A may include the high mobility oxide semiconductor film 41 and the low mobility oxide semiconductor film 42. Note that in this example, the layered portion pa is provided over the entire first region 4Ac of the oxide semiconductor layer 4A, but the layered portion pa may be provided in at least a part of the first region 4Ac of the oxide semiconductor layer 4A. As will be described later, the lower layer portion p1 or the upper layer portion p2 may be provided in a part of the first region 4Ac or in the second region.

The gate insulating layer 5A may cover the first region 4Ac and may not cover the first contact region 4As and the second contact region 4Ad. In the illustrated example, the gate insulating layer 5A is formed only in a region overlapping the gate electrode 7A when viewed from the normal direction of the substrate 1. An edge of the gate insulating layer 5A is aligned with an edge of the gate electrode 7A.

When viewed from the normal direction of the substrate 1, the gate electrode 7A is arranged on the gate insulating layer 5A so as to overlap the first region 4Ac and not to overlap the first contact region 4As and the second contact region 4Ad.

The oxide semiconductor layer 4A, the gate insulating layer 5A, and the gate electrode 7A are covered with an interlayer insulating layer 10. The interlayer insulating layer 10 may be in contact with part of upper faces of the oxide semiconductor layers 4A and 4B.

The source electrode 8A and the drain electrode 9A are arranged on, for example, the interlayer insulating layer 10. In this example, a first opening 10As that exposes the first contact region 4As of the oxide semiconductor layer 4A and a second opening 10Ad that exposes a part of the second contact region 4Ad are provided in the interlayer insulating layer 10. The source electrode 8A is arranged on the interlayer insulating layer 10 and in the first opening 10As, and is connected to the first contact region 4As in the first opening 10As. The drain electrode 9A is arranged on the interlayer insulating layer 10 and in the second opening 10Ad, and is connected to the second contact region 4Ad in the second opening 10Ad.

The TFT 100 may include a lower conductive layer 2A that functions as a light blocking layer on the substrate 1 side of the oxide semiconductor layer 4A. The lower conductive layer 2A is covered with a lower insulating layer 3. The oxide semiconductor layer 4A of the TFT 100 is arranged on the lower insulating layer 3. The lower conductive layer 2A may be arranged so as to overlap at least the first region 4Ac of the oxide semiconductor layer 4A when viewed from the normal direction of the substrate 1. This can suppress degradation in characteristics of the oxide semiconductor layer 4A caused by light from the substrate 1 side (backlight light). Note that the lower conductive layer 2A may be electrically in a floating state or may be fixed to the GND potential (0 V). Alternatively, the lower conductive layer 2A may function as a lower gate electrode by being electrically connected to the gate electrode 7A by a connection section (not illustrated) (double gate structure). As a result, the on current of the TFT 100 can be further increased. The TFT 100 to which the double gate structure is applied is suitably used for, for example, an SSD circuit.

On the other hand, the TFT 200, similar to the TFT 100, includes an oxide semiconductor layer 4B, a gate electrode 7B arranged on a part of the oxide semiconductor layer 4B with a gate insulating layer 5B interposed therebetween, and a source electrode 8B and a drain electrode 9B. The TFT 200 may include a lower conductive layer 2B that functions as a light blocking layer on the substrate 1 side of the oxide semiconductor layer 4B.

Similar to the oxide semiconductor layer 4A, the oxide semiconductor layer 4B has a first region 4Bc that overlaps the gate electrode 7A and a second region that does not overlap the gate electrode 7A when viewed from the normal direction of the substrate 1. The second region may be a low-resistance region having a lower specific resistance than the first region 4Ac.

The oxide semiconductor layer 4B also includes a first contact region 4Bs and a second contact region 4Bd so as to be located on both sides of the first region 4Bc respectively when viewed from the normal direction of the substrate 1. The first contact region 4Bs and the second contact region 4Bd are provided in the second region (low-resistance region). The first contact region 4Bs is a region electrically connected to the source electrode 8B, and the second contact region 4Bd is a region electrically connected to the drain electrode 9B.

In the TFT 200, in the first region 4Bc of the oxide semiconductor layer 4B, the upper layer portion p2 including the low mobility oxide semiconductor film 42 but not including the high mobility oxide semiconductor film 41 is provided. In the illustrated example, the entire oxide semiconductor layer 4B (including the first contact region 4Bs and the second contact region 4Bd) is the upper layer portion p2. Note that in the present embodiment, the upper layer portion p2 may be provided over the entire first region 4Bc of the oxide semiconductor layer 4B, and as will be described later, the high mobility oxide semiconductor film 41 may be provided in the second region (for example, the contact region) of the oxide semiconductor layer 4B.

The TFT 200 may have the same structure as the TFT 100 except for the structure of oxide semiconductor layer 4B. However, the planar shapes, sizes, channel lengths, channel widths, and the like in the respective layers in the TFT 100 and TFT 200 may be different from one another.

When the TFT 200 is used as the pixel transistor Tp (pixel TFT) illustrated in FIG. 1, the gate electrode 7B is electrically connected to the corresponding gate bus line GL. The gate electrode 7B may be integrally formed with the corresponding gate bus line GL by using the same conductive film as the gate bus line GL. The source electrode 8B is electrically connected to the corresponding source bus line SL. The source electrode 8B may be integrally formed with the corresponding source bus line SL by using the same conductive film as the source bus line SL. The drain electrode 9B is electrically connected to the corresponding pixel electrode PE.

The low mobility oxide semiconductor films 42 for the oxide semiconductor layers 4A and 4B of the TFT 100 and the TFT 200 are formed of the same oxide semiconductor film. The gate insulating layers 5A and 5B of the respective TFTs may be formed of the same insulating film, the gate electrodes 7A and 7B of the respective TFTs may be formed of the same conductive film (gate conductive film), and the source electrodes 8A and 8B and the drain electrodes 9A and 9B of the respective TFTs may be formed of the same conductive film (source conductive film). This allows the TFT 100 and the TFT 200 to be manufactured by a common process.

The structures of the TFT 100 and the TFT 200 are not limited to the structures illustrated in FIG. 2. For example, the source electrode and/or the drain electrode may be provided closer to the substrate than the oxide semiconductor layer. As will be described later, the source electrode 8B of the TFT 200 may be formed by using the same conductive film as the lower conductive layer 2B, and the oxide semiconductor layer 4B and the source electrode 8B may be connected in an opening formed in the lower insulating layer 3.

Effect

According to the present embodiment, it is possible to manufacture the TFT 100 and the TFT 200 having different characteristics from each other while using a common oxide semiconductor film (here, the low mobility oxide semiconductor film 42).

Figure 3:
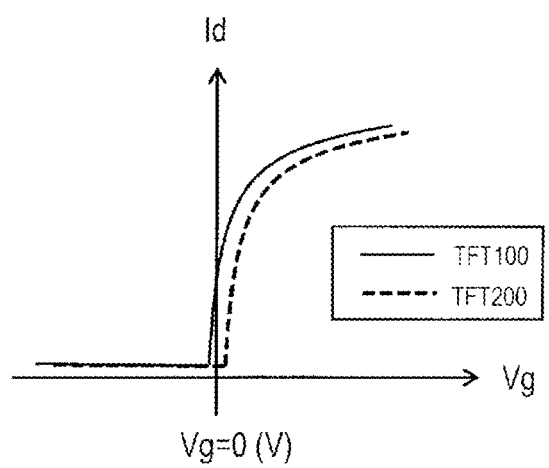
FIG. 3 is a diagram illustrating Vg-Id characteristics of the TFT 100 and the TFT 200.

FIG. 3 is a diagram illustrating Vg-Id characteristics of the TFT 100 and the TFT 200. The horizontal axis of the graph represents the potential of a gate electrode based on the potential of the drain electrode (gate-drain voltage) Vg, and the vertical axis of the graph represents a drain current Id.

From FIG. 3, it can be seen that the TFT 200 has a higher threshold voltage than the TFT 100. This is because in the TFT 200, in the first region 4Bc (channel region) of the oxide semiconductor layer 4B, the high mobility oxide semiconductor film 41 is not provided, so that the mobility in the entire first region is lower than that of the oxide semiconductor layer 4A including the high mobility oxide semiconductor film 41, and the threshold voltage is shifted in the positive direction.

The TFT 100 is suitably used for circuit TFTs, for example, an SSD circuit TFT or the like. The TFT 100 has the higher mobility than the TFT 200, and has a superior current driving force (on current). In addition, a channel can be shortened, thereby reducing a circuit area.

The TFT 200 is suitably used as a pixel TFT because the off-leak current is small. The pixel TFT may have enhancement characteristics that the threshold voltage is positive, or may have depletion characteristics that the threshold voltage is negative. Additionally, when the TFT 200 has the enhancement characteristics, the TFT 200 may be suitably used for circuit TFTs such as a drive circuit TFT. As a result, circuit malfunction can be suppressed, thereby reducing yield loss. Further, the TFT 200 may be used as an inspection TFT or an ESD protection TFT.

Alternatively, the TFT 100 and the TFT 200 may be mixed in the drive circuit. For example, among a plurality of TFTs included in the gate drive circuit, the TFTs 100 having the high mobility may be used as at least a TFT called as an "output transistor" (also referred to as a buffer transistor) (described later with reference to FIG. 18), and the TFT 200 may be used as any of the other TFTs.

Table 1 illustrates suitable characteristics of the pixel TFT, the drive circuit TFT, and the SSD circuit TFT in liquid crystal display devices. The characteristics and numerical ranges set forth in Table 1 are examples, and are not limited to the characteristics of each TFT.

TABLE 1

| Use of TFT | Pixel TFT | Drive circuit TFT | SSD circuit TFT Output transistor in drive circuit TFT |
|---|---|---|---|
| Threshold voltage | Depletion to enhancement −1 V or more | Enhancement 0 V or more | Depletion is possible for SSD circuit TFT −2 V or more |
| Mobility | Low to medium 5 $cm^2$/Vs or more 20 $cm^2$/Vs or less | Low to medium 5 $cm^2$/Vs or more 20 $cm^2$/Vs or less | High 20 $cm^2$/Vs or more |
| TFT structure | TFT 200 | TFT 200 | TFT 100 |

High Mobility Oxide Semiconductor Film 41 and Low Mobility Oxide Semiconductor Film 42

The composition, thickness, crystal structure, forming method, and the like of each of oxide semiconductor films are not particularly limited. Each of the high mobility oxide semiconductor film 41 and the low mobility oxide semiconductor film 42 may be a single-layer film or a layered film including a plurality of oxide semiconductor films. The mobility of the high mobility oxide semiconductor film 41

(when the high mobility oxide semiconductor film 41 is a layered film, the mobility of the entire layered film) may be higher than the mobility of the low mobility oxide semiconductor film 42.

The compositions of the high mobility oxide semiconductor film 41 and the low mobility oxide semiconductor film 42 may be different from each other. "Having different compositions" means that each of the layers contains different types of metal elements or metal elements with different composition ratios. As an example, each of the high mobility oxide semiconductor film 41 and the low mobility oxide semiconductor film 42 may include In and/or Sn, and a sum of atomic ratios of In and Sn to all metal elements in the high mobility oxide semiconductor film 41 may be larger than a sum of atomic ratios of In and Sn to all metal elements in the low mobility oxide semiconductor film 42.

For example, each of the high mobility oxide semiconductor film 41 and the low mobility oxide semiconductor film 42 may be made of In—Ga—Zn—O based oxide semiconductor layer, and an atomic ratio of In in the low mobility oxide semiconductor film 42 may be smaller than an atomic ratio of In in the high mobility oxide semiconductor film 41. Alternatively, an atomic ratio of Ga in the low mobility oxide semiconductor film 42 may be larger than an atomic ratio of Ga in the high mobility oxide semiconductor film 41.

Further, the high mobility oxide semiconductor film 41 may contain Sn, and the low mobility oxide semiconductor film 42 may not contain Sn. Instead, the low mobility oxide semiconductor film 42 may contain Sn at a lower concentration than the high mobility oxide semiconductor film 41. In other words, an atomic ratio of Sn to all metal elements in the low mobility oxide semiconductor film 42 may be smaller than an atomic ratio of Sn to all metal elements in the high mobility oxide semiconductor film 41.

As the low mobility oxide semiconductor film 42, for example, an In—Ga—Zn—O based semiconductor film (e.g., In:Ga:Zn=1:1:1) can be used. As the high mobility oxide semiconductor film 41, for example, an In—Ga—Zn—O based semiconductor film (for example, In:Ga:Zn=5:1:4), an In—Sn—Zn—O based semiconductor film, an In—Al—Sn—Zn—O based semiconductor film, an In—W—Zn—O based semiconductor film, an In—Sn—O based semiconductor film, an In—Zn—O based semiconductor film, an In—Ga—Sn—O based semiconductor film, an In—Sn—Ti—Zn—O based semiconductor film, or the like can be used.

Further, the low mobility oxide semiconductor film 42 and the high mobility oxide semiconductor film 41 may have different crystal structures from each other. For example, one of the low mobility oxide semiconductor film and the high mobility oxide semiconductor film may be an amorphous oxide semiconductor film, and the other may be a crystalline oxide semiconductor film containing a crystalline portion.

Further, even when the ratio of each metal element of the low mobility oxide semiconductor film and the ratio of each metal element of the high mobility oxide semiconductor film are the same, the mobilities of these oxide semiconductor films can be made different from each other by changing the film formation method or the film formation conditions. For example, the atmosphere in the chamber (for example, the flow ratio of oxygen to argon supplied to the chamber) when forming an oxide semiconductor film by sputtering may be different between the low mobility oxide semiconductor film and the high mobility oxide semiconductor film. Specifically, when forming the low mobility oxide semiconductor film 42, the flow ratio of oxygen to argon may be set to be large (for example, 80%), and when forming the high mobility oxide semiconductor film 41, the flow ratio of oxygen to argon may be set smaller than the low mobility oxide semiconductor film 42 (for example, 20%).

The thicknesses of the low mobility oxide semiconductor film 42 and the high mobility oxide semiconductor film 41 may be substantially the same or different. The high mobility oxide semiconductor film 41 may be thinner than the low mobility oxide semiconductor film 42. By thinning the high mobility oxide semiconductor film 41, the threshold voltage of the TFT using the high mobility oxide semiconductor film 41 can be set near 0 V. As a result, the TFT with a high on current is obtained while having the enhancement characteristics. A thickness of the high mobility oxide semiconductor film 41 may be 5 nm or more and 30 nm or less, for example. A thickness of the low mobility oxide semiconductor film 42 may be 20 nm or more and 100 nm or less, for example.

Figure 4:
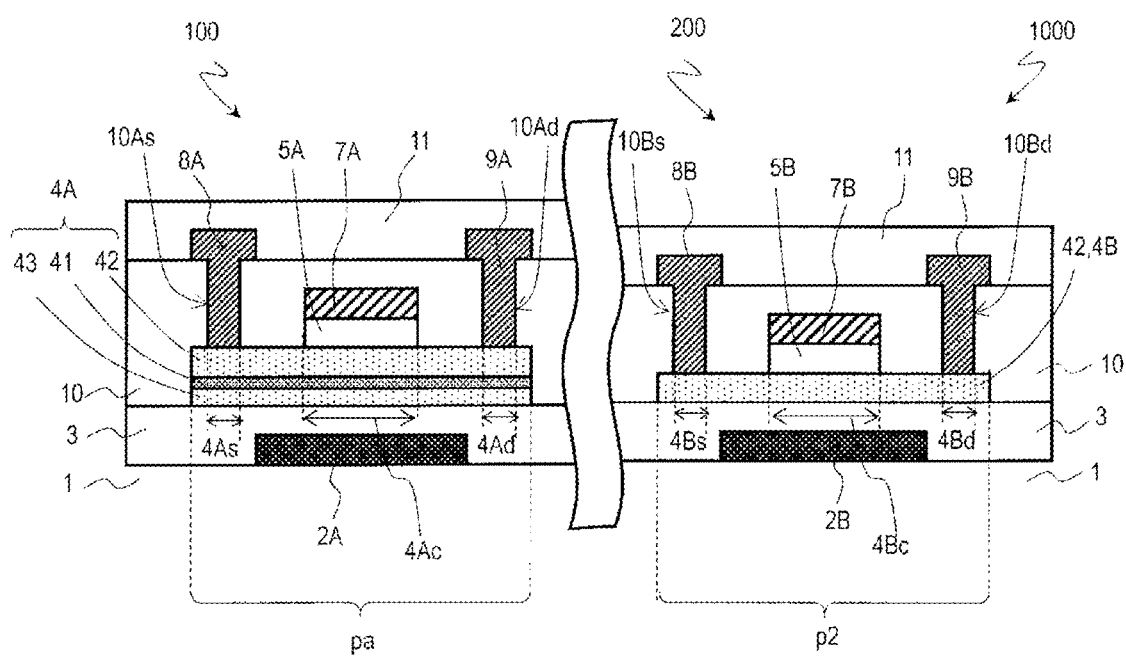
FIG. 4 is a cross-sectional view illustrating another example of the active matrix substrate 1000.

Each of the oxide semiconductor layers 4A and 4B may further include an oxide semiconductor film other than the high mobility oxide semiconductor film 41 and the low mobility oxide semiconductor film 42. For example, as illustrated in FIG. 4, the oxide semiconductor layer 4A of the TFT 100 may further include another oxide semiconductor film 43 having a lower mobility than the high mobility oxide semiconductor film 41 between the high mobility oxide semiconductor film 41 and the substrate 1, and the oxide semiconductor layer 4B of the TFT 200 may not include the other oxide semiconductor film 43. As the other oxide semiconductor film 43, for example, a low mobility oxide semiconductor film having a similar composition to the low mobility oxide semiconductor film 42 may be used. A thickness of the oxide semiconductor film 43 may be 5 nm or more and 30 nm or less, for example.

Manufacturing Method of Active Matrix Substrate 1000

Figure 5A:
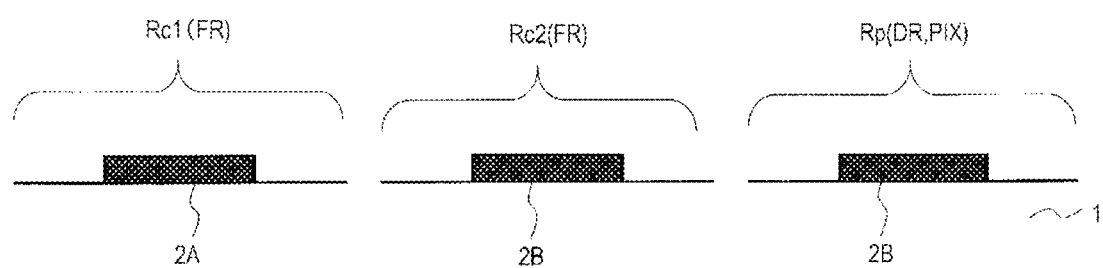
FIG. 5A is a process cross-sectional view illustrating a manufacturing method of the active matrix substrate 1000.
Figure 5B:
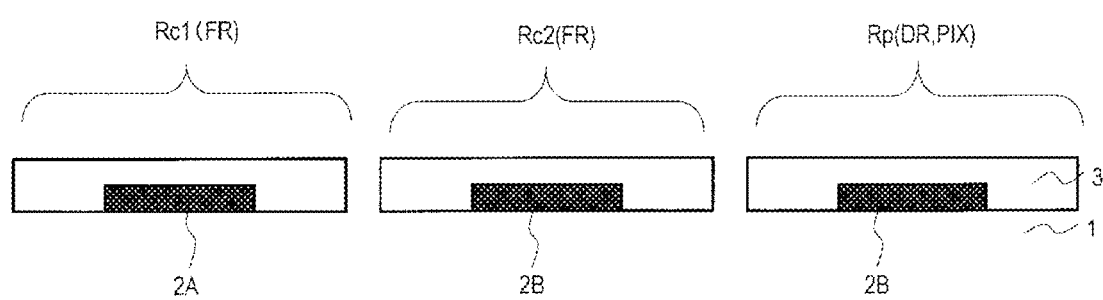
FIG. 5B is a process cross-sectional view illustrating the manufacturing method of the active matrix substrate 1000.
Figure 5C:
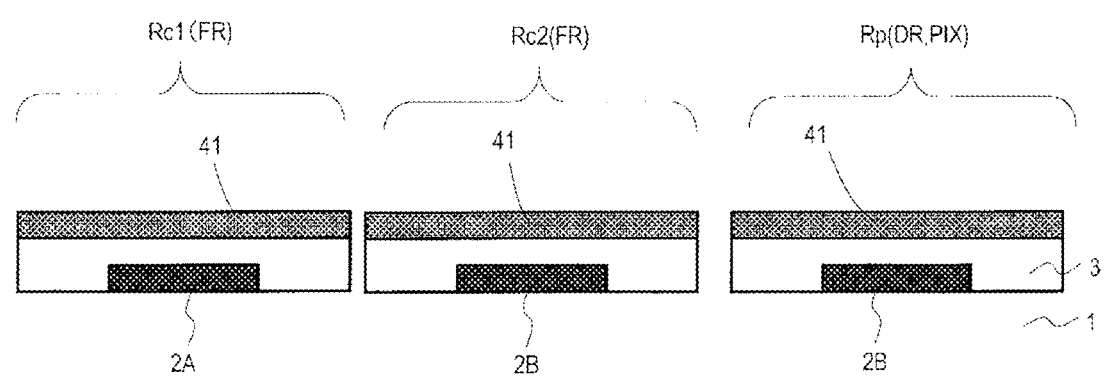
FIG. 5C is a process cross-sectional view illustrating the manufacturing method of the active matrix substrate 1000.
Figure 5D:
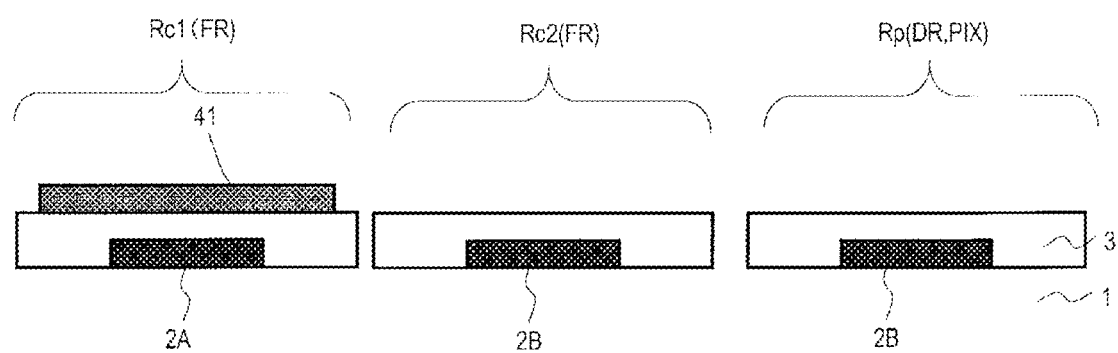
FIG. 5D is a process cross-sectional view illustrating the manufacturing method of the active matrix substrate 1000.
Figure 5E:
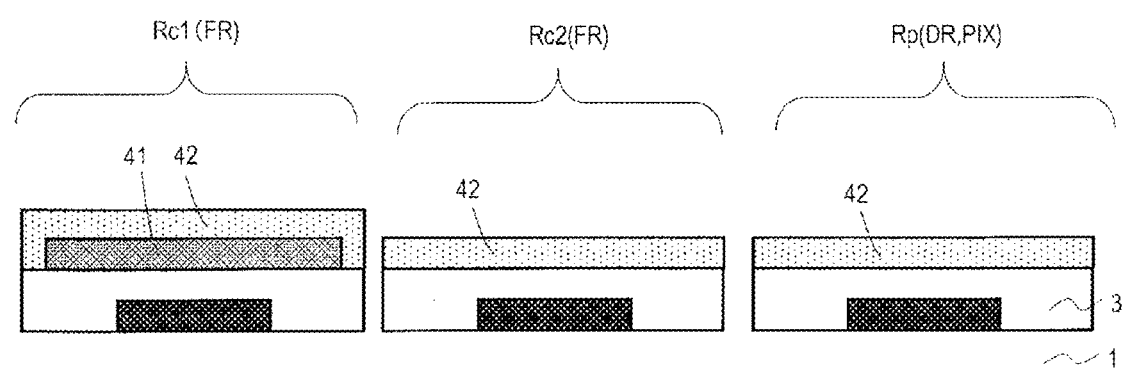
FIG. 5E is a process cross-sectional view illustrating the manufacturing method of the active matrix substrate 1000.
Figure 5F:
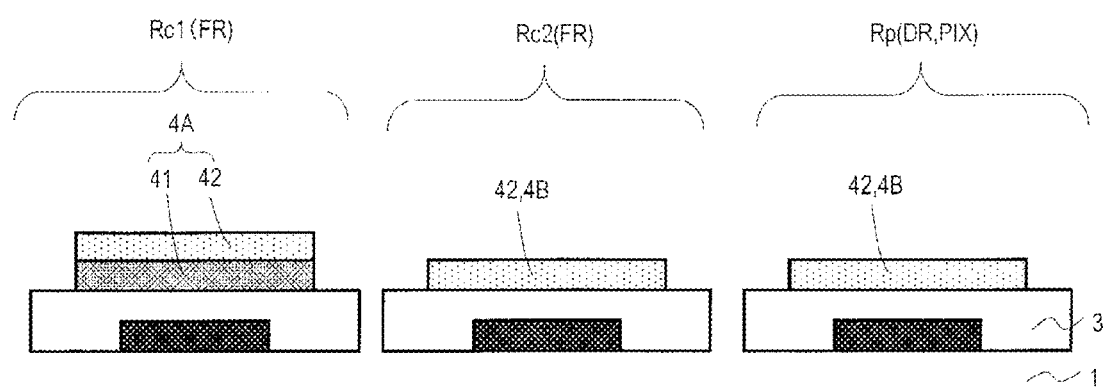
FIG. 5F is a process cross-sectional view illustrating the manufacturing method of the active matrix substrate 1000.
Figure 5G:
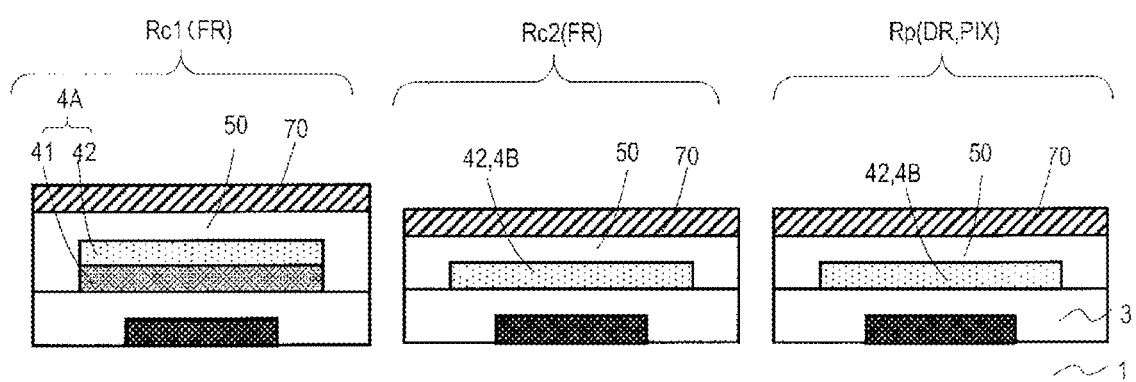
FIG. 5G is a process cross-sectional view illustrating the manufacturing method of the active matrix substrate 1000.
Figure 5H:
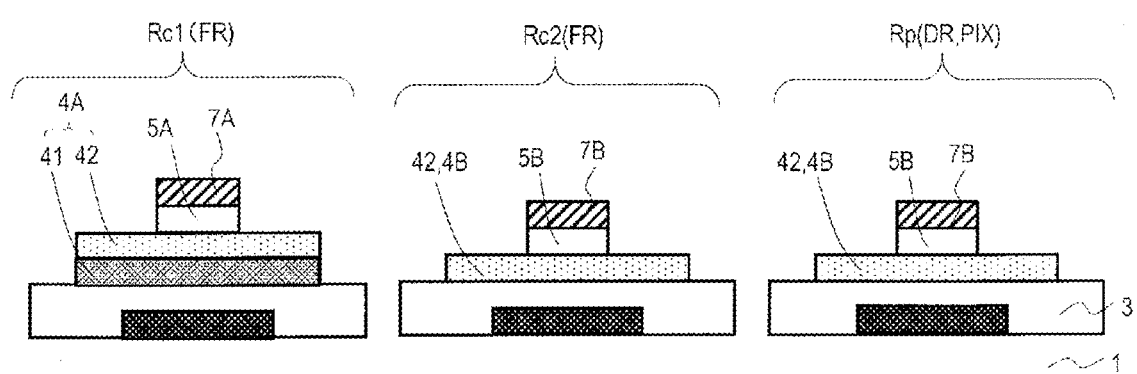
FIG. 5H is a process cross-sectional view illustrating the manufacturing method of the active matrix substrate 1000.
Figure 5I:
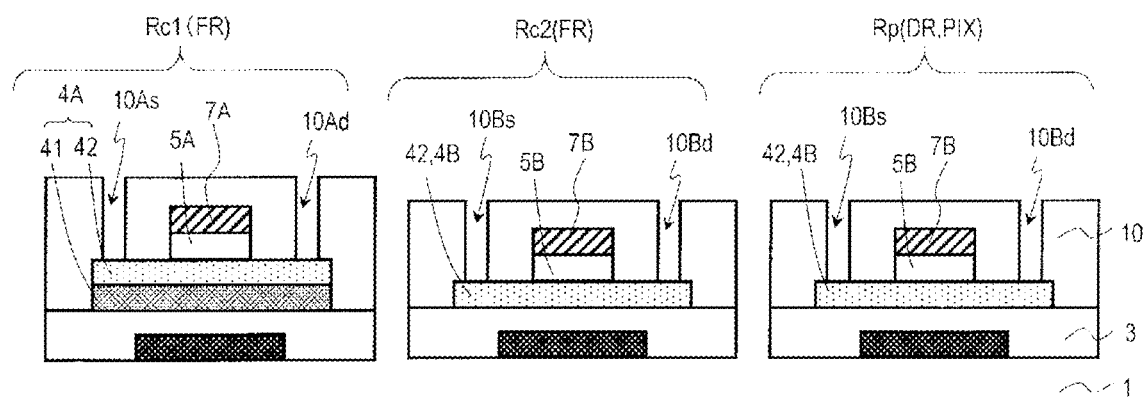
FIG. 5I is a process cross-sectional view illustrating the manufacturing method of the active matrix substrate 1000.
Figure 5J:
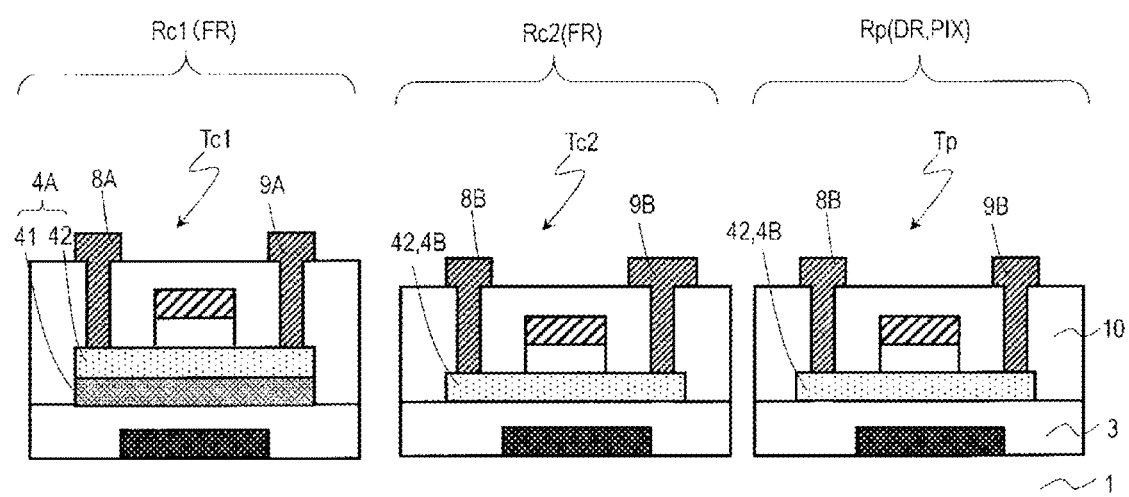
FIG. 5J is a process cross-sectional view illustrating the manufacturing method of the active matrix substrate 1000.
Figure 5K:
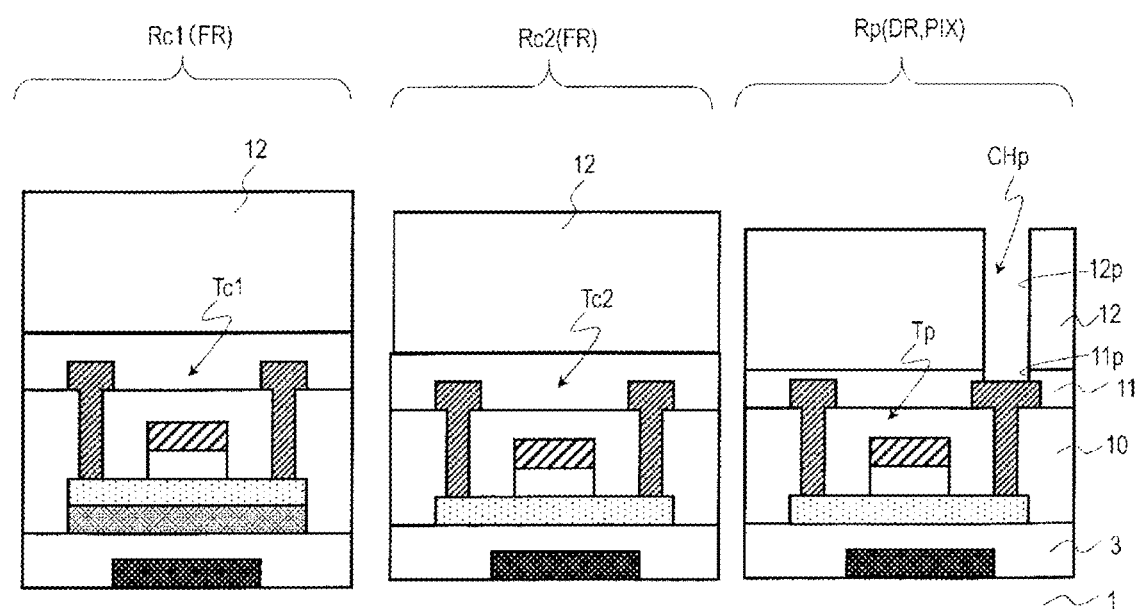
FIG. 5K is a process cross-sectional view illustrating the manufacturing method of the active matrix substrate 1000.
Figure 5L:
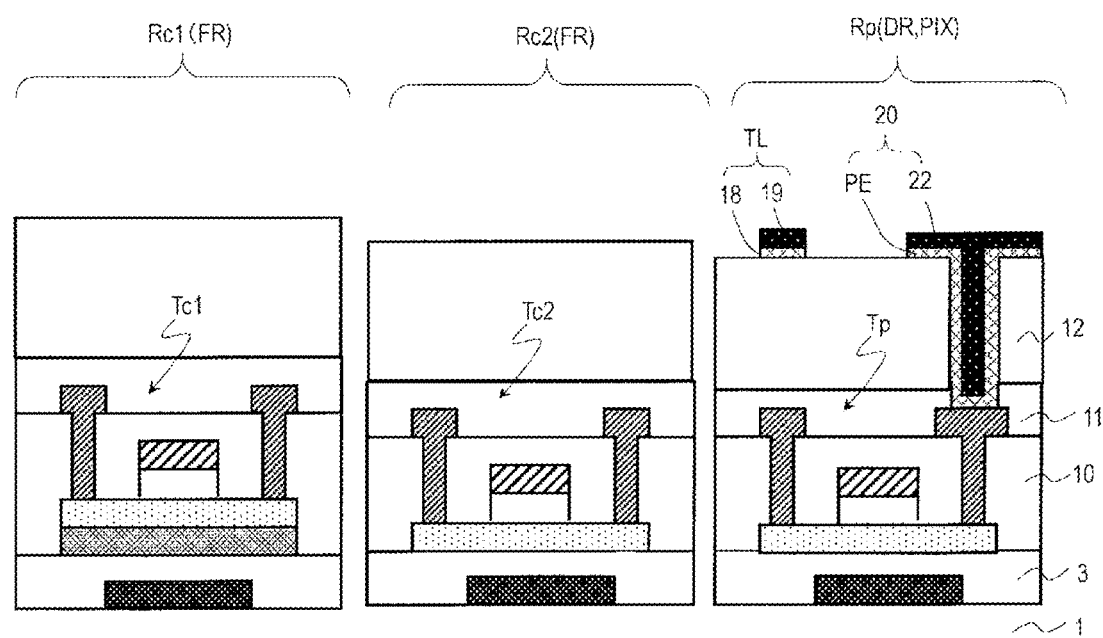
FIG. 5L is a process cross-sectional view illustrating the manufacturing method of the active matrix substrate 1000.
Figure 5M:
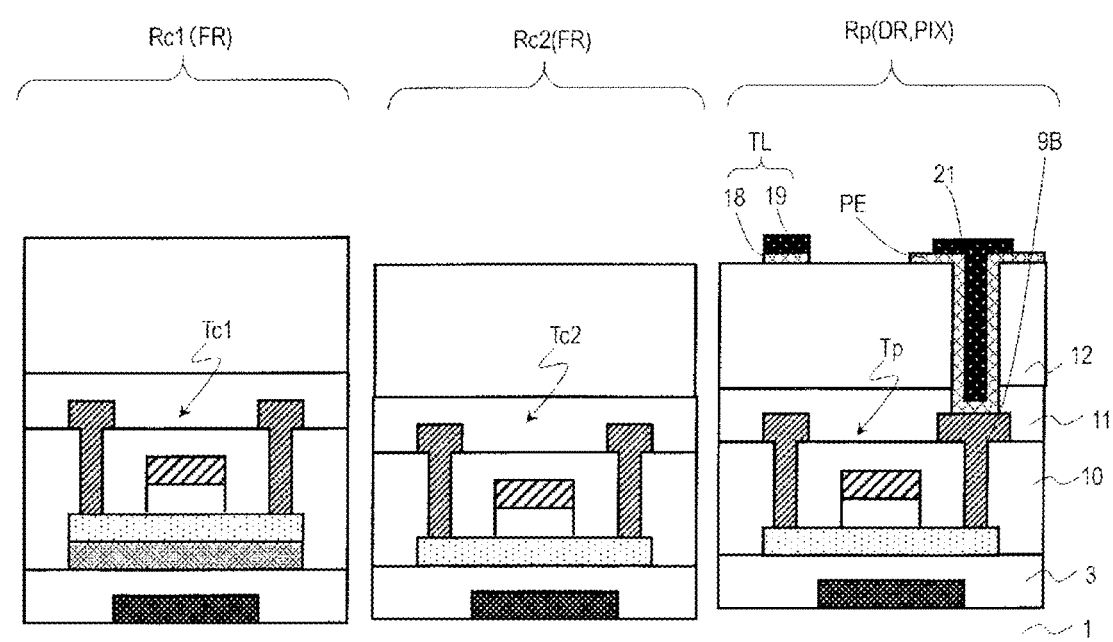
FIG. 5M is a process cross-sectional view illustrating the manufacturing method of the active matrix substrate 1000.
Figure 5N:
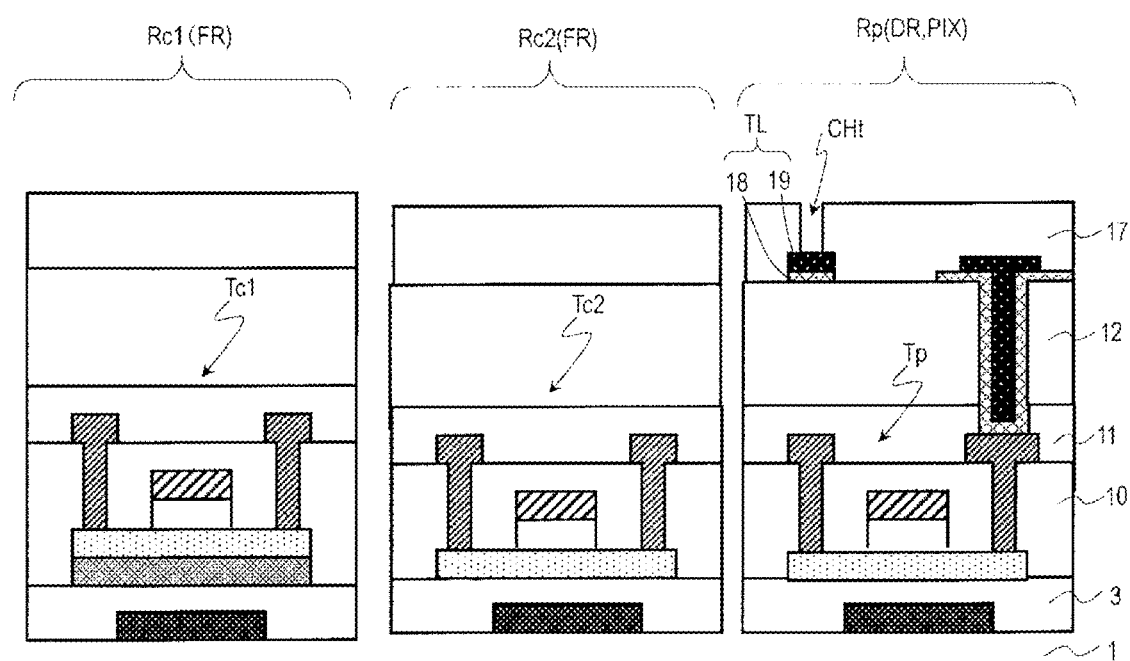
FIG. 5N is a process cross-sectional view illustrating the manufacturing method of the active matrix substrate 1000.
Figure 6:
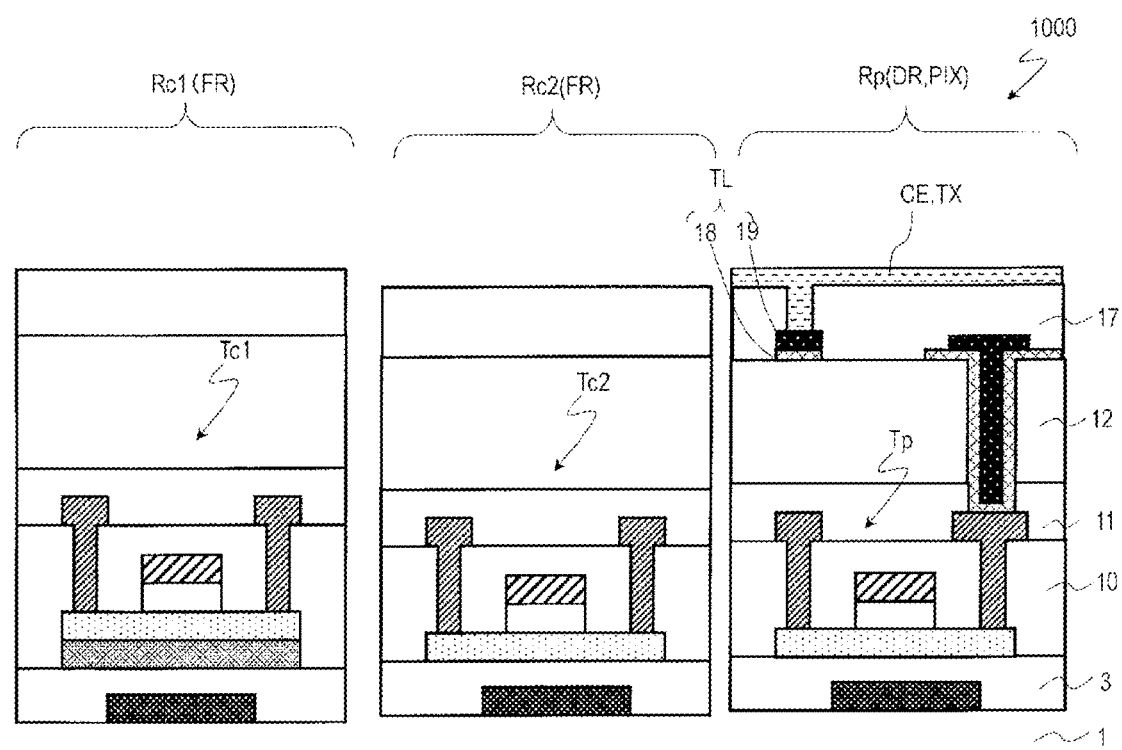
FIG. 6 is a schematic cross-sectional view of the active matrix substrate 1000.

FIGS. 5A to 5N and 6 are process cross-sectional views of steps for explaining the manufacturing method of the active matrix substrate 1000, respectively.

Here, an active matrix substrate applied to an FFS mode in-cell touch panel liquid crystal display device will be described as an example. In addition to the pixel electrodes and the common electrode, such an active matrix substrate further includes a plurality of electrodes for touch sensors (hereinafter, "touch sensor electrode") and a plurality of wiring lines for driving and/or detecting the touch sensors (hereinafter, referred to as "touch wiring line").

In this example, a first circuit transistor Tc1 and a second circuit transistor Tc2 that constitute the peripheral circuit are formed in the non-display region FR of the active matrix substrate 1000, and the pixel transistor Tp is formed in each of the pixel areas PIX in the display region DR. The first circuit transistor Tc1 is the first TFT, and is used in, for example, an SSD circuit. The second circuit transistor Tc2 is the second TFT, and is used in, for example, a drive circuit. The pixel transistor Tp is the second TFT. Note that the use of each TFT is not limited to the illustrated example. In the following description, a region where the first circuit transistor Tc1 is formed is referred to as a "TFT formation region Rc1", a region where the second circuit transistor Tc2 is formed is referred to as a "TFT formation region Rc2", and a region where the pixel transistor is formed is referred to as a "TFT formation region Rp".

Step 1: Formation of Lower Conductive Layer (FIG. 5A)

A lower conductive film (having a thickness, for example, 50 nm or more and 500 nm or less) is formed on the substrate 1 by, for example, sputtering. Next, the lower conductive film is patterned by a known photolithography process. In this way, as illustrated in FIG. 5A, the lower conductive layer 2A is formed in the TFT formation region Rc1, and the lower conductive layer 2B is formed in the TFT formation regions Rc2 and Rp.

As the substrate 1, a transparent substrate with insulating property, for example, a glass substrate, a silicon substrate, a heat-resistant plastic substrate (resin substrate), or the like can be used.

The material of the lower conductive film is not particularly limited, and a film containing a metal such as aluminum (Al), tungsten (W), molybdenum (Mo), tantalum (Ta), chromium (Cr), titanium (Ti), copper (Cu) or the like, or an alloy thereof, or a metal nitride thereof can be appropriately used. Further, a layered film obtained by layering such a plurality of films may be used.

Here, a single-layer film of a metal film (or an alloy film) containing Cu or Al is used as the lower conductive film. Alternatively, a layered film having a metal film containing Cu or Al as a top layer may be used.

Step 2: Formation of Lower Insulating Layer 3 (FIG. 5B)

Subsequently, as illustrated in FIG. 5B, the lower insulating layer 3 (having a thickness of, for example, 200 nm or more and 600 nm or less) is formed so as to cover the lower conductive layers 2A and 2B.

The lower insulating layer 3 is formed by CVD, for example. As the lower insulating layer 3, a silicon oxide (SiOx) layer, a silicon nitride (SiNx) layer, a silicon oxynitride (SiOxNy; x>y) layer, a silicon nitride oxide (SiNxOy; x>y) layer, or the like may be used as appropriate. The lower insulating layer 3 may be a single-layer or may include a layered structure. For example, a silicon nitride (SiNx) layer, a silicon nitride oxide layer, or the like may be formed on a substrate side (lower layer) in order to prevent diffusion of impurities and the like from the substrate 1, and a silicon dioxide ($SiO_2$) layer, a silicon oxynitride layer, or the like may be formed on a layer (upper layer) on the former layer in order to ensure insulating properties.

Step 3: Formation of High Mobility Oxide Semiconductor Film 41 (FIG. 5C)

Subsequently, as illustrated in FIG. 5C, the high mobility oxide semiconductor film 41 is formed on the lower insulating layer 3.

The high mobility oxide semiconductor film 41 may be formed by sputtering, for example. Here, as the high mobility oxide semiconductor film 41, an In—Ga—Zn—O based semiconductor film (for example, In:Ga:Zn=5:1:4) having a thickness of 10 nm is formed. Alternatively, a film containing Sn such as an In—Sn—Zn—O based semiconductor film (for example, $In_2O_3$—$SnO_2$—ZnO) having a thickness of 10 nm may be formed.

In this step, a layered film including the high mobility oxide semiconductor film 41 may be formed. For example, a layered film may be formed in which another oxide semiconductor film having a lower mobility than the high mobility oxide semiconductor film 41 is used as a lower layer and the high mobility oxide semiconductor film 41 is used as an upper layer. As a result, the TFT structure illustrated in FIG. 4 is obtained.

Step 4: Patterning of High Mobility Oxide Semiconductor Film 41 (FIG. 5D)

Subsequently, the high mobility oxide semiconductor film 41 is patterned. As a result, in the high mobility oxide semiconductor film 41, portions located in the TFT formation regions Rc2 and Rp are removed. In the high mobility oxide semiconductor film 41, a portion located in the TFT formation region Rc1 is left unremoved. The high mobility oxide semiconductor film 41 remaining in the TFT formation region Rc1 may have a size larger than the portion to be the oxide semiconductor layer.

The patterning of the high mobility oxide semiconductor film 41 may be performed by dry etching or wet etching. In a case of wet etching, when the high mobility oxide semiconductor film 41 is an In—Ga—Zn—O based semiconductor film, a PAN-based etching solution or an oxalic acid-based etching solution can be used, and when the high mobility oxide semiconductor film 41 is an In—Sn—Zn—O based semiconductor film, an oxalic acid-based etching solution can be used.

Step 5: Formation of Low Mobility Oxide Semiconductor Film 42 (FIG. 5E)

Subsequently, as illustrated in FIG. 5E, the low mobility oxide semiconductor film 42 is formed so as to cover the lower insulating layer 3 and the patterned high mobility oxide semiconductor film 41. Here, an In—Ga—Zn—O based semiconductor film (for example, In:Ga:Zn=1:1:1 or 4:2:4) having a thickness of 40 nm is formed as the low mobility oxide semiconductor film 42.

Step 6: Patterning of High Mobility Oxide Semiconductor Film 41 and Low Mobility Oxide Semiconductor Film 42 (FIG. 5F)

Subsequently, the layered film including the high mobility oxide semiconductor film 41 and the low mobility oxide semiconductor film 42 is patterned. As a result, as illustrated in FIG. 5F, the oxide semiconductor layer 4A having a layered structure including the high mobility oxide semiconductor film 41 and the low mobility oxide semiconductor film 42 is formed in the TFT formation region Rc1. In the TFT formation regions Rc2 and Rp, the oxide semiconductor layer 4B including the low mobility oxide semiconductor film 42 and not including the high mobility oxide semiconductor film 41 is formed.

The patterning of the layered film may be performed by dry etching or wet etching. In a case of wet etching, a PAN-based etching solution or an oxalic acid-based etching solution may be used when the high mobility oxide semiconductor film 41 and the low mobility oxide semiconductor film 42 are both In—Ga—Zn—O based semiconductor films. An oxalic acid-based etching solution may be used when the high mobility oxide semiconductor film 41 is an In—Sn—Zn—O based semiconductor film and the low mobility oxide semiconductor film 42 is an In—Ga—Zn—O based semiconductor film. As a result, the high mobility oxide semiconductor film 41 and the low mobility oxide semiconductor film 42 can be simultaneously (collectively) etched. In this case, a side surface of the high mobility oxide semiconductor film 41 and a side surface of the low mobility oxide semiconductor film 42 are aligned with each other in the oxide semiconductor layer 4A.

The high mobility oxide semiconductor film 41 and the low mobility oxide semiconductor film 42 may be annealed before or after patterning the high mobility oxide semiconductor film 41 and the low mobility oxide semiconductor film 42.

Step 7: Formation of Gate Insulating Film 50 and Gate Conductive Film 70 (FIG. 5G)

Subsequently, as illustrated in FIG. 5G, a gate insulating film 50 and a gate conductive film 70 (having a thickness of, for example, 50 nm or more and 500 nm or less) are formed on part of the oxide semiconductor layers 4A and 4B in this order.

As the gate insulating film 50, an insulating film similar to the lower insulating layer 3 (insulating film exemplified as the lower insulating layer 3) can be used. Here, a silicon oxide (SiO$_2$) film is formed as the gate insulating film 50. when an oxide film such as a silicon oxide film is used as the gate insulating film, oxidation deficiencies generated in the channel regions of the oxide semiconductor layers 4A and 4B can be reduced by the oxide film, so that the resistance reduction in the channel region can be suppressed.

As the gate conductive film 70, for example, a metal such as molybdenum (Mo), tungsten (W), aluminum (Al), copper (Cu), titanium (Ti), tantalum (Ta) and the like or an alloy thereof can be used. The gate conductive film 70 may have a layered structure including a plurality of layers made of different conductive materials. Here, as the gate conductive film, a Cu/Cu alloy layered film having a Cu alloy film as a lower layer and a Cu film as an upper layer is used. Alternatively, a Cu/Ti layered film or a Cu/Mo layered film may be used.

Step 8: Formation of Gate Insulating layers 5A and 5B and Gate Electrodes 7A and 7B (FIG. 5H)

Subsequently, as illustrated in FIG. 5H, the gate insulating layers 5A and 5B and the gate electrodes 7A and 7B are formed.

First, the gate conductive film 70 is patterned by a known photolithography process. As a result, the gate electrode 7A is formed in the TFT formation region Rc1, and the gate electrode 7B is formed in the TFT formation regions Rc2 and Rp, respectively. Although not illustrated, the gate bus line is also formed by using the gate conductive film 70. In the oxide semiconductor layers 4A and 4B, the portions overlapping the gate electrodes 7A and 7B when viewed from the normal direction of the substrate 1 are the first regions 4Ac and 4Bc including the channel region, respectively.

Next, the gate insulating film 50 is patterned using a resist mask used for patterning the gate conductive film 70 or using the gate electrodes 7A and 7B as masks to form the gate insulating layers 5A and 5B. In this way, when viewed from the normal direction of the substrate 1, side surfaces of the gate electrodes 7A and 7B are aligned with side surfaces of the gate insulating layers 5A and 5B, respectively. However, it may not be aligned depending on the etching conditions of the respective films. For example, the gate electrodes 7A and 7B are over-etched to greatly shift the side surfaces of the gate electrodes 7A and 7B from the side surfaces of the resist mask. Thereafter, when the gate insulating film 50 is dry etched using a resist mask, the side surfaces of the gate electrodes 7A and 7B may be located inside the side surfaces of the gate insulating layers 5A and 5B when viewed from the normal direction of the substrate 1 (see FIG. 7C).

Note that after patterning the gate insulating film 50, the gate conductive film may be formed and patterned.

After forming the gate electrodes 7A and 7B, the oxide semiconductor layers 4A and 4B may be subjected to lowering the resistance. Plasma processing may be performed as the processing for lowering the resistance, for example. As a result, when viewed from the normal direction of the main surface of the substrate 1, in the oxide semiconductor layers 4A and 4B, regions overlapping neither the gate electrodes 7A and 7B nor the gate insulating layers 5A and 5B (exposed regions) are low-resistance regions having a lower specific resistance than the regions overlapping the gate electrodes 7A and 7B and the gate insulating layers 5A and 5B (including the channel regions). The low-resistance region may be a conductive region (e.g., sheet resistance of 200Ω/□ or less). In the present embodiment, when viewed from the normal direction of the substrate 1, the oxide semiconductor layers 4A and 4B that include the first regions 4Ac and 4Bc overlapping the gate electrodes 7A and 7B and low-resistance regions that are located on both sides of the first regions and have a specific resistance lower than that of the first regions 4Ac and 4Bc are obtained. Note that the method of the processing for lowering the resistance is not limited to plasma processing.

Step 9: Formation of Interlayer Insulating Layer 10 (FIG. 5I)

Subsequently, the interlayer insulating layer 10 covering the oxide semiconductor layers 4A and 4B, the gate insulating layers 5A and 5B, and the gate electrodes 7A and 7B is formed. Thereafter, the interlayer insulating layer 10 is patterned by the known photolithography process. As a result, as illustrated in FIG. 5I, in the TFT formation region Rc1, the interlayer insulating layer 10 is formed with the first opening 10As and the second opening 10Ad that expose the contact regions 4As and 4Ad that are part of the low-resistance region of the oxide semiconductor layer 4A, and in the TFT formation regions Rc2 and Rp, the interlayer insulating layer 10 is formed with a first opening 10Bs and a second opening 10Bd that expose the contact regions 4Bs and 4Bd that are part of the low-resistance region of the oxide semiconductor layer 4B.

The interlayer insulating layer 10 can be formed with a single-layer or a multi-layer of an inorganic insulating layer such as a silicon oxide film, a silicon nitride film, a silicon oxynitride film, a silicon nitride oxide film and the like. The thickness of the inorganic insulating layer may be 100 nm or more and 500 nm or less. It is preferable to form the interlayer insulating layer 10 by using an insulating film that reduces an oxide semiconductor such as a silicon nitride film, because the specific resistance of the regions of the oxide semiconductor layers 4A and 4B in contact with the interlayer insulating layer 10 (here, the low-resistance regions) can be maintained low. Here, an SiNx layer (having a thickness of 300 nm) is formed as the interlayer insulating layer 10 by the CVD.

When an insulating layer capable of reducing an oxide semiconductor (for example, a hydrogen donating layer such as a silicon nitride layer) is used as the interlayer insulating layer 10, even when the above-mentioned processing for lowering resistance is not performed, in the oxide semiconductor layers 4A and 4B, the portions being in contact with the interlayer insulating layer 10 can be made lower in resistance than the portions that are not contact with the interlayer insulating layer 10.

Step 10: Formation of Source Electrodes 8A and 8B and Drain Electrodes 9A and 9B (FIG. 5J)

Subsequently, the source conductive film (having a thickness of, for example, 50 nm or more and 500 nm or less) (not illustrated) is formed on the interlayer insulating layer 10, and the source conductive film is patterned. As a result, as illustrated in FIG. 5J, the source electrodes 8A and 8B and the drain electrodes 9A and 9B are formed. Although not illustrated, the source bus line is also formed of the source conductive film. In this way, the first circuit transistor Tc1 and the second circuit transistor Tc2 are formed in the TFT formation region Rc1 and the TFT formation region Rc2 in the non-display region FR, respectively. Further, the pixel transistor Tp is formed in the TFT formation region Rp in each pixel area PIX.

The source electrodes 8A and 8B are arranged on the interlayer insulating layer 10 and in the openings 10As and 10Bs, respectively, and are connected to the first contact regions 4As and 4Bs of the oxide semiconductor layers 4A and 4B in the openings 10As and 10Bs, respectively. The drain electrodes 9A and 9B are arranged on the interlayer insulating layer 10 and in the openings 10Ad and 10Bd, respectively, and are connected to the second contact regions 4Ad and 4Bd of the oxide semiconductor layers 4A and 4B in the openings 10Ad and 10Bd, respectively.

As the source conductive film, an element selected from aluminum (Al), chromium (Cr), copper (Cu), tantalum (Ta), titanium (Ti), molybdenum (Mo), and tungsten (W), or an alloy containing these elements as components can be used. For example, the second conductive film may have a triple-layer structure of titanium film-aluminum film-titanium film, or a triple-layer structure of molybdenum film-aluminum film-molybdenum film can be used. Note that the source conductive film is not limited to the triple-layer structure, and may have a single-layer or a dual-layer structure, or a layered structure of four or more layers. Here, a layered film having a Ti film (having a thickness of 15 to 70 nm) as a lower layer and a Cu film (having a thickness of 50 to 400 nm) as an upper layer are used. By using a layered film using an ohmic conductive film such as a Ti film as the lowest layer, the contact resistance with the oxide semiconductor layers 4A and 4B can be reduced more effectively.

Step 11: Formation of Inorganic Insulating Layer 11 and Organic Insulating Layer 12 (FIG. 5K)

Subsequently, as illustrated in FIG. 5K, an inorganic insulating layer 11 (having a thickness of 100 nm or more and 500 nm or less, for example) and an organic insulating layer 12 (having a thickness of 1 to 4 μm, preferably 2 to 3 μm, for example) are formed in this order so as to cover the interlayer insulating layer 10, the source electrodes 8A and 8B, and the drain electrodes 9A and 9B.

Thereafter, in each pixel area PIX, an opening 12p for exposing a part of the inorganic insulating layer 11 is formed in the organic insulating layer 12. Next, the inorganic insulating layer 11 is etched using the organic insulating layer 12 as a mask, and an opening 11p exposing the drain electrode 9B is provided in the inorganic insulating layer 11. In this way, a pixel contact hole CHp constituted of the openings 11p and 12p is formed.

As the inorganic insulating layer 11, an inorganic insulating film similar to that of the interlayer insulating layer 10 can be used. Here, as the inorganic insulating layer 11, for example, an SiNx layer (having a thickness of 300 nm) is formed by the CVD. The organic insulating layer 12 may be, for example, an organic insulating film containing a photo-sensitive resin material (for example, an acrylic resin film).

Step 12: Formation of Pixel Electrode PE and Wiring Line TL (FIG. 5L)

Subsequently, a first transparent conductive film (having a thickness of, 20 to 300 nm) and a touch wiring line conductive film (having a thickness of 200 nm, for example) (both not illustrated) are formed on the organic insulating layer 12. Thereafter, the first transparent conductive film and the touch wiring line conductive film are patterned using, for example, a hydrogen peroxide based etching solution containing a fluorine compound. As a result, as illustrated in FIG. 5L, a touch wiring line TL and a layered film 20 including the pixel electrode PE are formed so as to be separated from each other.

The touch wiring line TL has a layered structure including a lower layer 18 formed of the first transparent conductive film and an upper layer 19 formed of the touch wiring line conductive film.

The layered film 20 includes the pixel electrode PE and a conductive layer 22 that is located on the pixel electrode PE and formed of the touch wiring line conductive film. The pixel electrode PE is electrically connected to the drain electrode 9B of the pixel TFT in the pixel contact hole CHp.

In the present embodiment, when viewed from the normal direction of the substrate 1, the lower layer 18 and the upper layer 19 are aligned with each other, and the pixel electrode PE and the conductive layer 22 are aligned with each other.

As the first transparent conductive film, a metal oxide such as indium-zinc oxide, indium-tin oxide (ITO), ZnO or the like can be used.

A conductive film similar to the gate conductive film or the source conductive film can be used as the touch wiring line conductive film. The touch wiring line conductive film may be a metal film (having a thickness of 50 to 500 nm) containing mainly Cu or Al and having a single-layer or layered structure.

Step 13: Patterning of Conductive Layer 22 (FIG. 5M)

As illustrated in FIG. 5M, a first electrode 21 is obtained by patterning the conductive layer 22. The patterning of the conductive layer 22 is performed under the conditions such that only the conductive layer 22 is etched without etching the pixel electrode PE. Here, the conductive layer 22 is wet etched using, for example, a hydrogen peroxide based etching solution that does not contain a fluorine compound.

Forming the first electrode 21 by the method described above has the following advantages.

When only the first transparent conductive film (for example, indium-tin oxide (ITO)) is formed on the organic insulating layer 12 and in the pixel contact hole CHp and patterned, since the first transparent conductive film is relatively thin, pinholes are likely to be formed in the pixel contact hole CHp. When a pinhole is formed in the first transparent conductive film in the pixel contact hole CHp, the surface of the drain electrode DE may be exposed by the pinhole and may be damaged. In contrast, in the present embodiment, the first transparent conductive film and the touch wiring line conductive film are simultaneously patterned to form the layered film 20 including the pixel electrode PE in a state where the touch wiring line conductive film is formed on the first transparent conductive film. As a result, the first transparent conductive film (pixel electrode PE) is less likely to have pinholes. In addition, even when pinholes form, the surface of the drain electrode DE can be protected because the drain electrode DE is covered with the touch wiring line conductive film. Therefore, an increase in contact resistance of a pixel contact portion due to pinholes can be suppressed. Further, thereafter, in the touch wiring line conductive film (conductive layer 22) covering the entire pixel electrode PE, a portion located other than the pixel contact portion (that is, a portion located in a region contributing to display) is removed. Thereby forming the first electrode 21. As a result, a decrease in the pixel aperture ratio due to the use of the touch wiring line conductive film can be suppressed.

Step 14: Formation of Dielectric Layer 17 (FIG. 5N)

Subsequently, as illustrated in FIG. 5N, a dielectric layer 17 (having a thickness of 50 to 500 nm) is formed so as to cover the touch wiring line TL, the pixel electrode PE, and the first electrode 21. Thereafter, the dielectric layer 17 is patterned to form a touch contact hole CHt that exposes a part of the upper layer 19 of the touch wiring line TL.

A material of the dielectric layer 17 may be the same as the material exemplified as the material of the inorganic insulating layer 11. Here, as the dielectric layer 17, for example, a SiN film is formed by the CVD.

Step 15: Formation of Common Electrode CE (FIG. 6)

Subsequently, a second transparent conductive film (having a thickness of 20 to 300 nm) is formed on the dielectric layer 17 and in the touch contact hole CHt, and the second transparent conductive film is patterned. As a result, the common electrode CE including a plurality of segments, each of which functions as a touch sensor electrode TX, is formed. Each touch sensor electrode TX is connected to the corresponding touch wiring line TL in the touch contact hole CHt. In this manner, the active matrix substrate 1000 is manufactured.

Figure 7A:
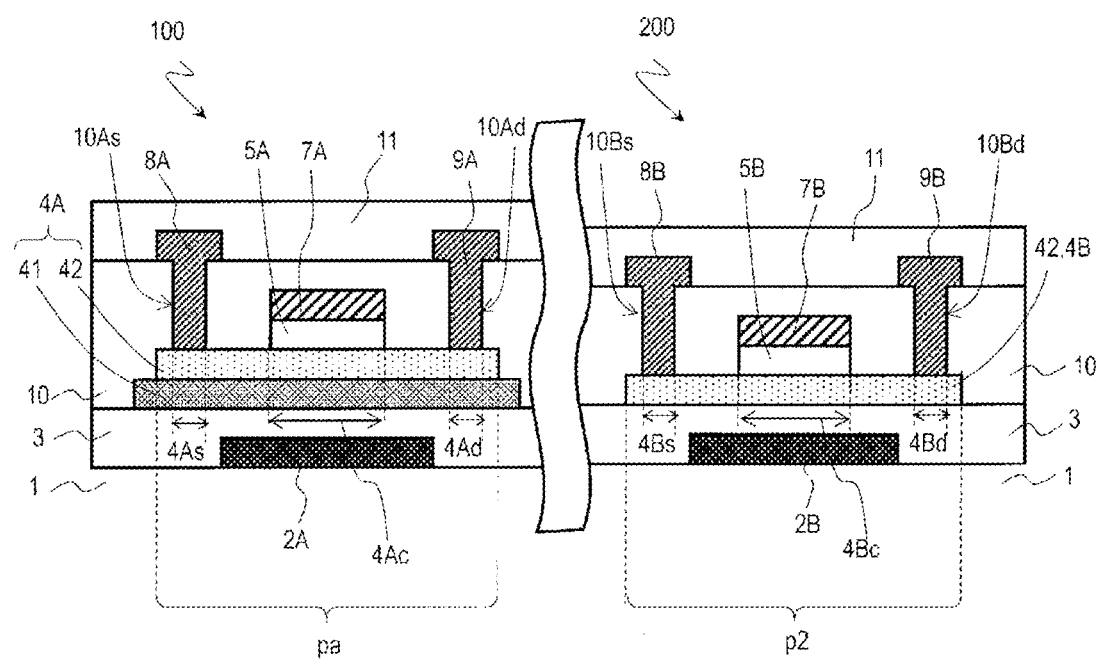
FIG. 7A is a cross-sectional view for explaining another example of the first TFT 100.
Figure 7B:
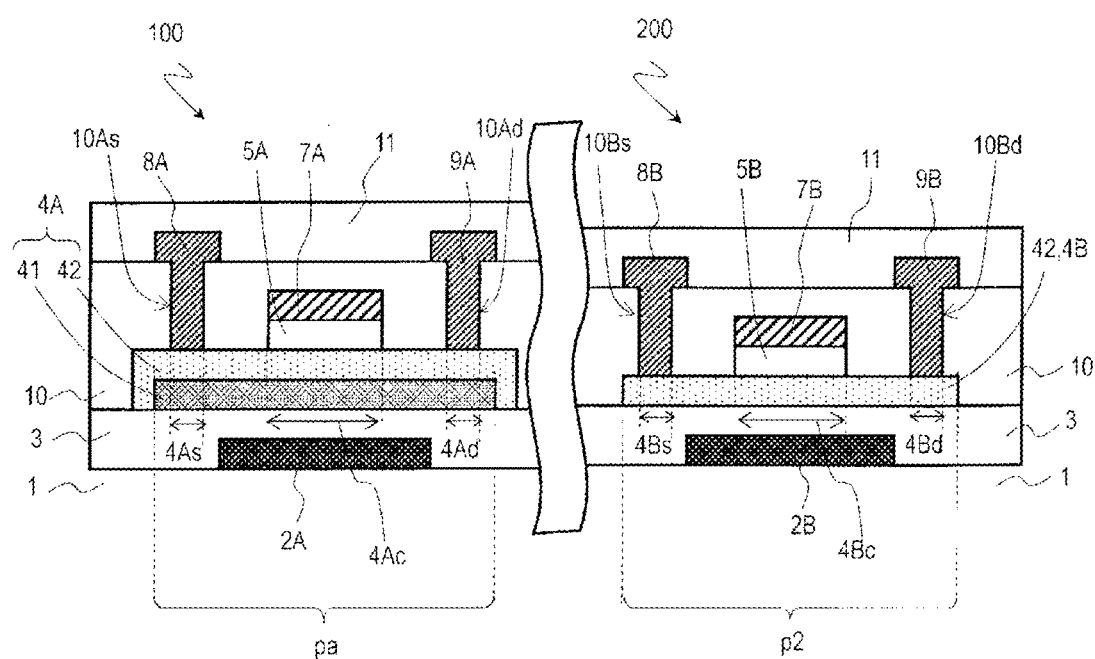
FIG. 7B is a cross-sectional view for explaining still another example of the first TFT 100.
Figure 7C:
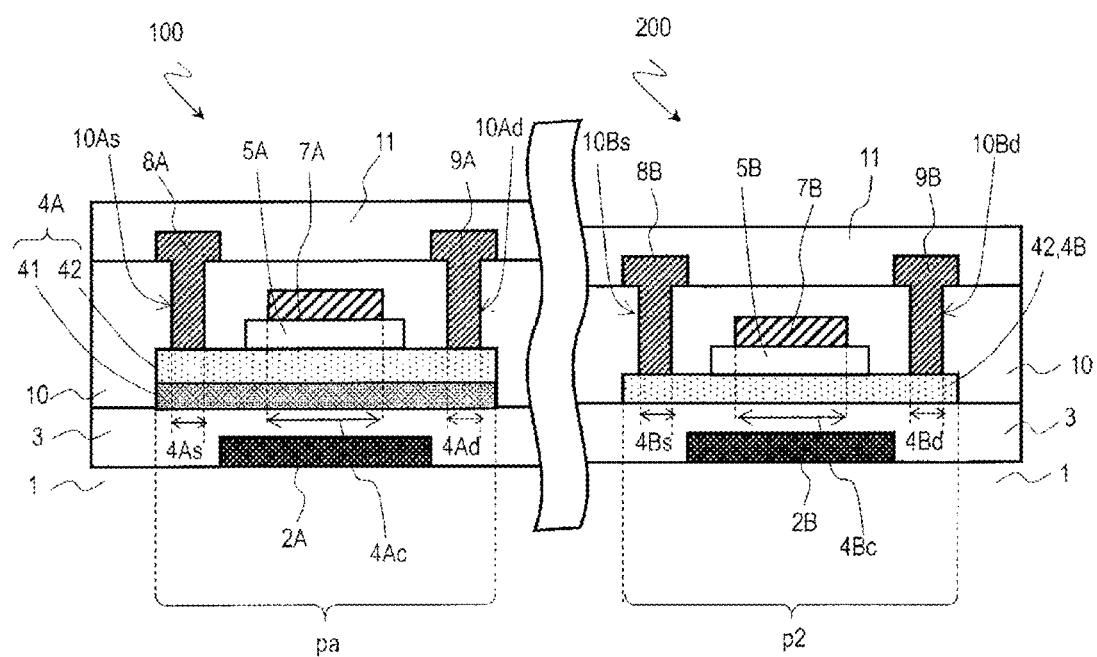
FIG. 7C is a cross-sectional view illustrating still another example of the active matrix substrate 1000.

The manufacturing method of the active matrix substrate 1000 of the present embodiment is not limited to the above method. In Step 4, the lower layer of the oxide semiconductor layer 4A may be formed by etching the high mobility oxide semiconductor film 41, and in Step 6, only the low mobility oxide semiconductor film 42 may be etched. For example, when the high mobility oxide semiconductor film 41 is an oxide semiconductor film containing Sn and the low mobility oxide semiconductor film 42 is an oxide semiconductor film not containing Sn, only the low mobility oxide semiconductor film 42 can be selectively etched by using a PAN-based etching solution. In this manner, when the low mobility oxide semiconductor film 42 and the high mobility oxide semiconductor film 41 are separately etched, the side surface of the high mobility oxide semiconductor film 41 and the side surface of the low mobility oxide semiconductor film 42 may not be aligned with each other in the oxide semiconductor layer 4A. For example, as illustrated in FIG. 7A, when the width of the low mobility oxide semiconductor film 42 may be smaller than that of the high mobility oxide semiconductor film 41, and when viewed from the normal direction of the substrate 1, the low mobility oxide semiconductor film 42 may be located within the upper face of the high mobility oxide semiconductor film 41. As a result, in the surface of the high mobility oxide semiconductor film 41, the area of the portion exposed from the low mobility oxide semiconductor film 42 increases. Therefore, the specific resistance in the low-resistance region of the oxide semiconductor layer 4A can be further reduced by lowering the resistance. Alternatively, as illustrated in FIG. 7B, the width of the low mobility oxide semiconductor film 42 may be larger than that of the high mobility oxide semiconductor film 41, and the low mobility oxide semiconductor film 42 may cover the upper face and the side surface of the high mobility oxide semiconductor film 41. By making the size of the high mobility oxide semiconductor film 41 smaller than that of the low mobility oxide semiconductor film 42 in this way, the depletion of TFT 100 is less likely to occur.

The structure of the active matrix substrate 1000 is also not limited to the structure illustrated in FIG. 6. The pixel electrode PE and the common electrode CE may be arranged so as to face with each other with the dielectric layer 17 interposed therebetween. Here, an example in which the common electrode CE is arranged on the pixel electrode PE with the dielectric layer 17 interposed therebetween is illustrated, but the common electrode CE may be arranged on the substrate 1 side of the pixel electrode PE.

In addition, although the active matrix substrate to be used in the in-cell touch panel liquid crystal display device is described herein as an example, the active matrix substrate of the present embodiment may be used in a liquid crystal display device that does not have a built-in touch panel. In that case, the touch wiring line TL, the touch electrode TX, and the first electrode 21 may not be formed, or only the first electrode 21 may be formed.

Modification Example 1

In the second TFT according to the present embodiment, at least one electrode of the source electrode and the drain electrode may be arranged on the substrate side of the oxide semiconductor layer with the lower insulating layer interposed therebetween. In this case, at least one of the first contact region and the second contact region in the second TFT may include a connection layer made of the high mobility oxide semiconductor film on the substrate side of the low mobility oxide semiconductor film. The connection layer is electrically connected to the source electrode or the drain electrode in an opening in the lower insulating layer. As a result, the contact resistance between the oxide semiconductor layer and the source electrode or the drain electrode can be reduced.

Hereinafter, an active matrix substrate of a modification example 1 will be described by taking as an example an active matrix substrate having a structure in which the source bus line SL is located closer to the substrate 1 than the gate bus line GL and the active layer of the pixel TFT (referred to as a "lower source wiring line structure").

In the active matrix substrate having the lower source wiring line structure, the insulating layer located between the source bus line and the gate bus line can be thickened, so that the parasitic capacitance generated at intersections with these bus lines can be reduced. In addition, the capacitance generated between the source bus line and the common electrode can also be reduced. The lower source wiring line structure is described, for example, in WO 2015/186619 by the applicant. The entire contents of the disclosure of WO 2015/186619 are incorporated herein by reference.

Figure 8:
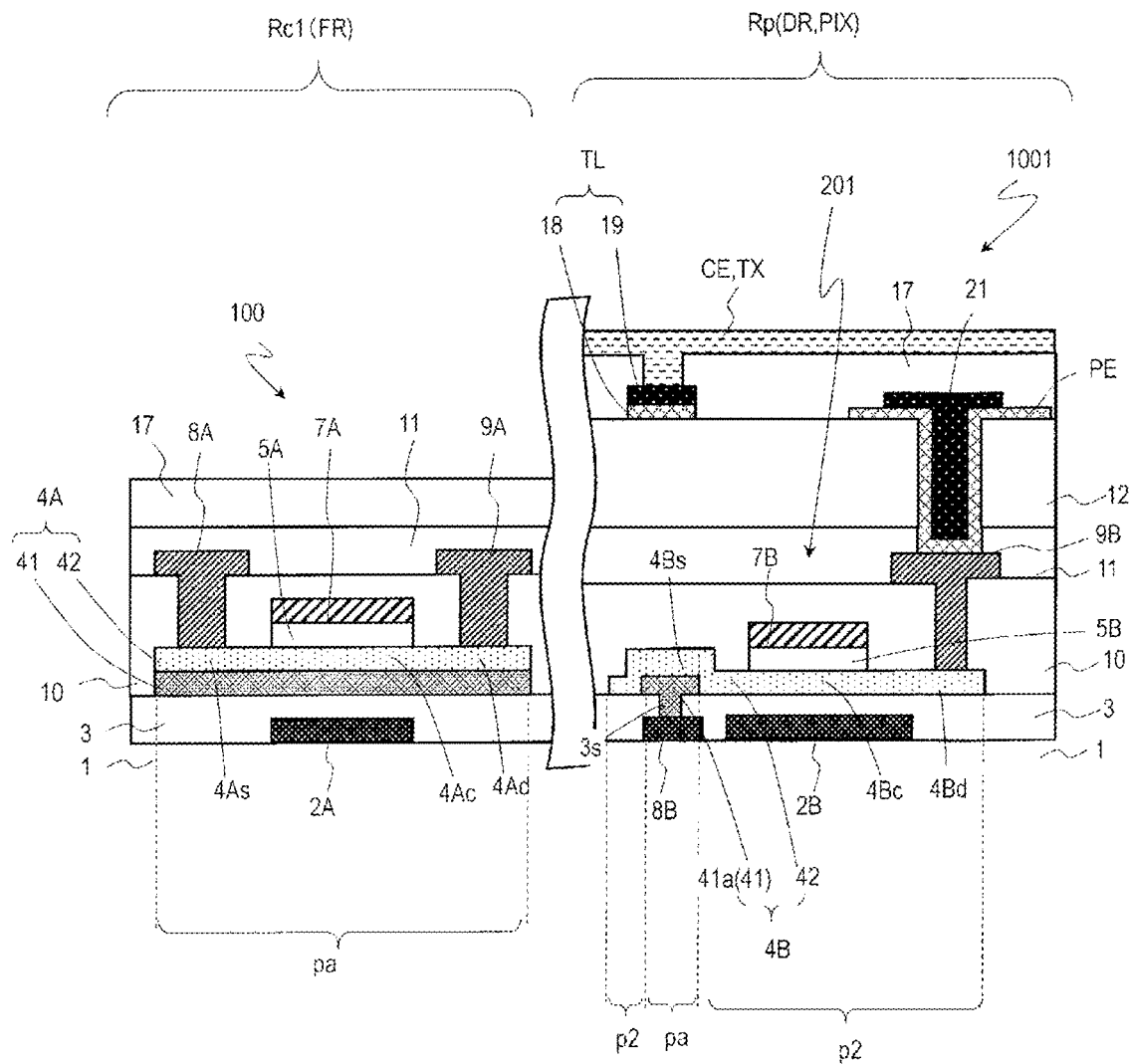
FIG. 8 is a schematic cross-sectional view of an active matrix substrate 1001 of a modification example 1.

FIG. 8 is a schematic cross-sectional view illustrating the first TFT 100 and a second TFT 201 in an active matrix substrate 1001 of the modification example 1 according to the present embodiment. Here, an example in which the first TFT 100 is used for a circuit TFT such as an SSD circuit TFT and the second TFT 201 is used for a pixel TFT will be described.

The active matrix substrate 1001 has a lower source wiring line structure. Hereinafter, the points different from the active matrix substrate 1000 will be mainly described, and the description of the same structure will be omitted.

In the active matrix substrate 1001, the source electrode 8B and the source bus line SL (not illustrated) of the second TFT 201, which is the pixel TFT, are formed in the same layer as the lower conductive layer 2B (that is, using the same conductive film). The source electrode 8B is electrically connected to the source bus line SL. The source electrode 8B may be a portion of the source bus line SL. The drain electrode 9B may be arranged on the interlayer insulating layer 10. The first contact region 4Bs of the oxide semiconductor layer 4B is electrically connected to the source electrode 8B (or the source bus line SL) in an opening 3s formed in the lower insulating layer 3. Such a structure can be obtained by forming the opening 3s by adding a step of patterning the lower insulating layer 3 after forming the lower insulating layer 3 and before forming the high mobility oxide semiconductor film 41.

In the illustrated example, the first contact region 4Bs of the first TFT 100 includes a layered portion pa that includes a connection layer 41a made of the high mobility oxide semiconductor film 41 and the low mobility oxide semiconductor film 42. In the opening 3s, the high mobility oxide semiconductor film 41 and the source electrode 8B are electrically connected via the connection layer 41a made of the high mobility oxide semiconductor film 41. By providing the connection layer 41a with a high mobility, it is possible to reduce the contact resistance between the oxide semiconductor layer 4B and the source bus line SL.

The first TFT 100 may have a similar structure to the first TFT 100 illustrated in FIG. 2. That is, similarly to the active matrix substrate 1000, the source electrodes 8A and 8B and the drain electrodes 9A and 9B may be arranged on the interlayer insulating layer 10. Although not illustrated, the active matrix substrate 1001 may further include a second TFT 200 illustrated in FIG. 2, for example, as a drive circuit TFT.

Note that the source electrodes 8A and 8B and the drain electrodes 9A and 9B of the first TFT 100 and the second TFT 200 and the drain electrode 9B of the second TFT 201 may also be formed in the same layer as the lower conductive layers 2A and 2B as necessary.

FIGS. 9A to 9D are process cross-sectional views for explaining a manufacturing method of the active matrix substrate 1001. Here, an example is illustrated in which the first circuit transistor Tc1 and the second circuit transistor Tc2 are formed in the non-display region FR, and the pixel transistor Tp is formed in each of the pixel areas PIX in the display region DR. The first circuit transistor Tc1 is the first TFT 100 and is used in, for example, an SSD circuit. The second circuit transistor Tc2 is the second TFT 200, and is used in, for example, a drive circuit. The pixel transistor Tp is the second TFT 201. The regions forming the first circuit transistor Tc1, the second circuit transistor Tc2, and the pixel transistor Tp are designated as TFT formation regions Rc1, Rc2, and Rp, respectively. Hereinafter, the points different from the manufacturing method of the active matrix substrate 1000 will be mainly described, and the description of the same steps will be omitted.

Figure 9A:
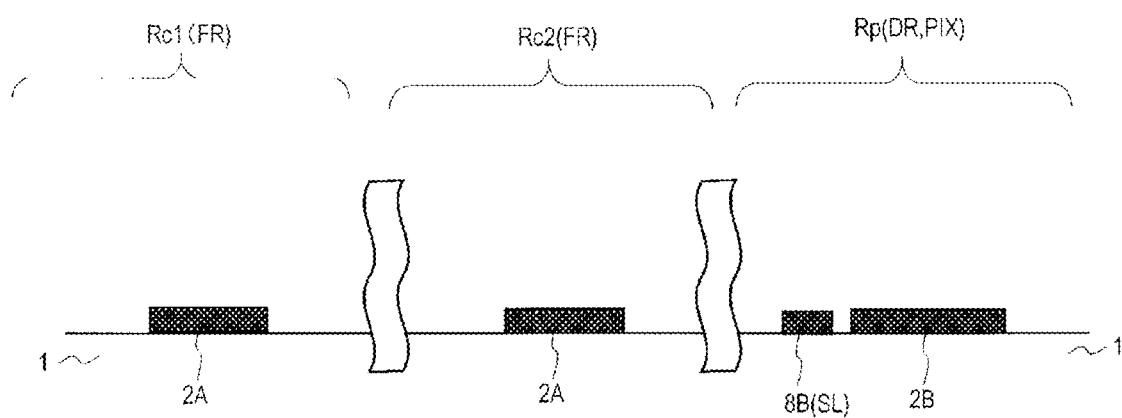
FIG. 9A is a process cross-sectional view illustrating a manufacturing method of the active matrix substrate 1001.

First, as illustrated in FIG. 9A, the lower conductive film is formed on the substrate 1 and patterned to form the lower conductive layer 2A in the TFT formation region Rc1 and the lower conductive layer 2B in the TFT formation region Rc2. Further, in the TFT formation region Rp, the lower conductive layer 2B and the source electrode 8B (or the source bus line SL) are formed by using the lower conductive film.

Figure 9B:
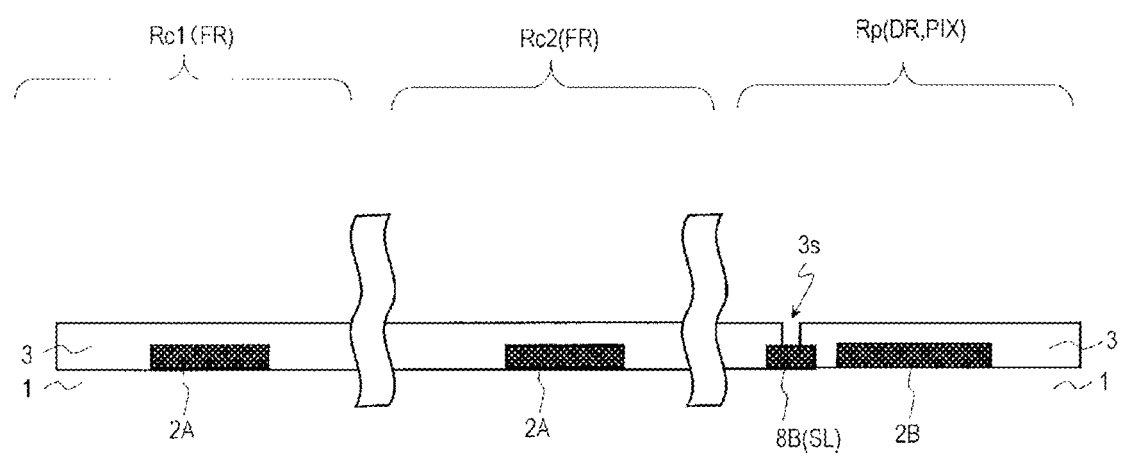
FIG. 9B is a process cross-sectional view illustrating the manufacturing method of the active matrix substrate 1001.

Subsequently, as illustrated in FIG. 9B, the lower insulating layer 3 is formed so as to cover the lower conductive layers 2A and 2B and the source electrode 8B. Thereafter, the lower insulating layer 3 is patterned to provide the opening 3s exposing a part of the lower source electrode 8B in the TFT formation region Rp.

Figure 9C:
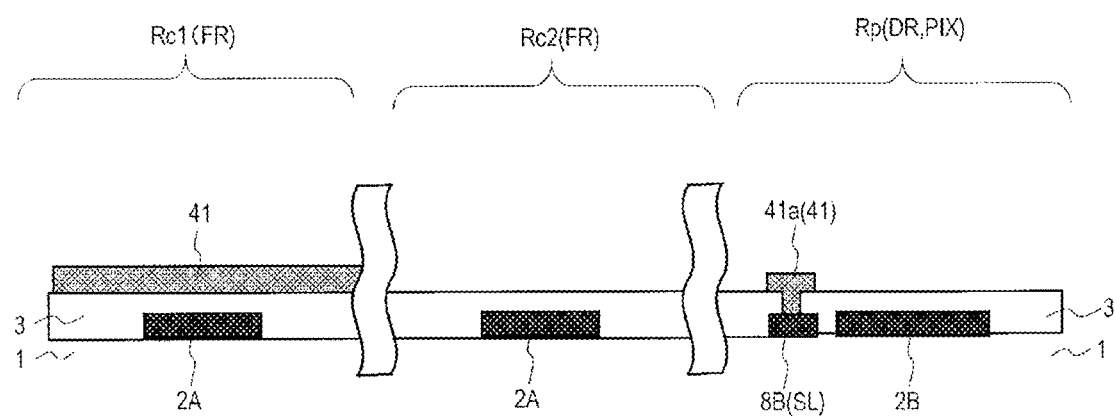
FIG. 9C is a process cross-sectional view illustrating the manufacturing method of the active matrix substrate 1001.

Subsequently, as illustrated in FIG. 9C, the high mobility oxide semiconductor film 41 is formed, and the high mobility oxide semiconductor film 41 is patterned. As a result, in the high mobility oxide semiconductor film 41, a portion located in the TFT formation region Rc1 is left, and, a portion located in the TFT formation region Rc2 is removed. Further, in the TFT formation region Rp, the connection layer 41a is formed using the high mobility oxide semiconductor film 41. The connection layer 41a is arranged in the opening 3p and on the lower insulating layer 3, and is connected to the source electrode 8B in the opening 3p.

Figure 9D:
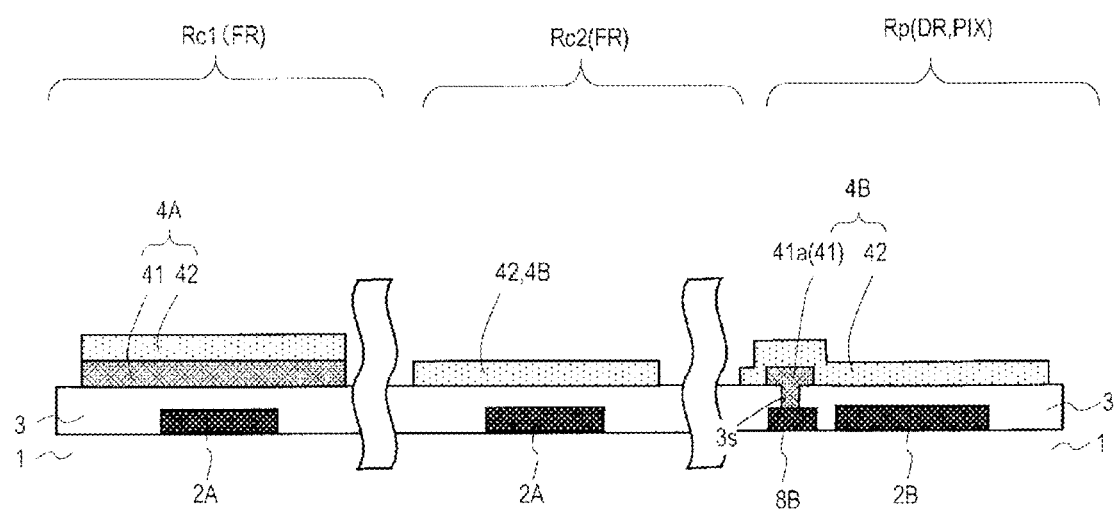
FIG. 9D is a process cross-sectional view illustrating the manufacturing method of the active matrix substrate 1001.

Subsequently, as illustrated in FIG. 9D, the low mobility oxide semiconductor film 42 is formed, and the high mobility oxide semiconductor film 41 and the low mobility oxide semiconductor film 42 are patterned.

As a result, the oxide semiconductor layer 4A including the high mobility oxide semiconductor film 41 and the low mobility oxide semiconductor film 42 is formed in the TFT formation region Rc1. By patterning the low mobility oxide semiconductor film 42, the oxide semiconductor layer 4B including the low mobility oxide semiconductor film 42 and not including the high mobility oxide semiconductor film 41 is formed in the TFT formation region Rc2. By arranging the low mobility oxide semiconductor film 42 so as to cover the connection layer 41a, the oxide semiconductor layer 4B including the connection layer 41a and the low mobility oxide semiconductor film 42 is formed in the TFT formation region Rp. In the first contact region 4Bs of the oxide semiconductor layer 4B, the layered portion pa including the connection layer 41a and the low mobility oxide semiconductor film 42 is provided, and in the portion to be the first region, the upper layer portion p2 including the low mobility oxide semiconductor film 42 and not including the high mobility oxide semiconductor film 41 is provided.

Although not illustrated, the subsequent steps are similar to those for the active matrix substrate 1000. However, in the TFT formation region Rp, the first opening 10Bs is not formed in the interlayer insulating layer 10, and a source electrode is not formed on the interlayer insulating layer 10.

Note that, in the above description, the active matrix substrate having the lower source wiring line structure is described as an example, but the modification example can also be applied to an active matrix substrate having no lower source wiring line structure. For example, the active layer structure of the second TFT of the modification example may be applied to a circuit TFT connected to a wiring line formed in the same layer as the lower conductive layer.

Modification Example 2

Figure 10A:
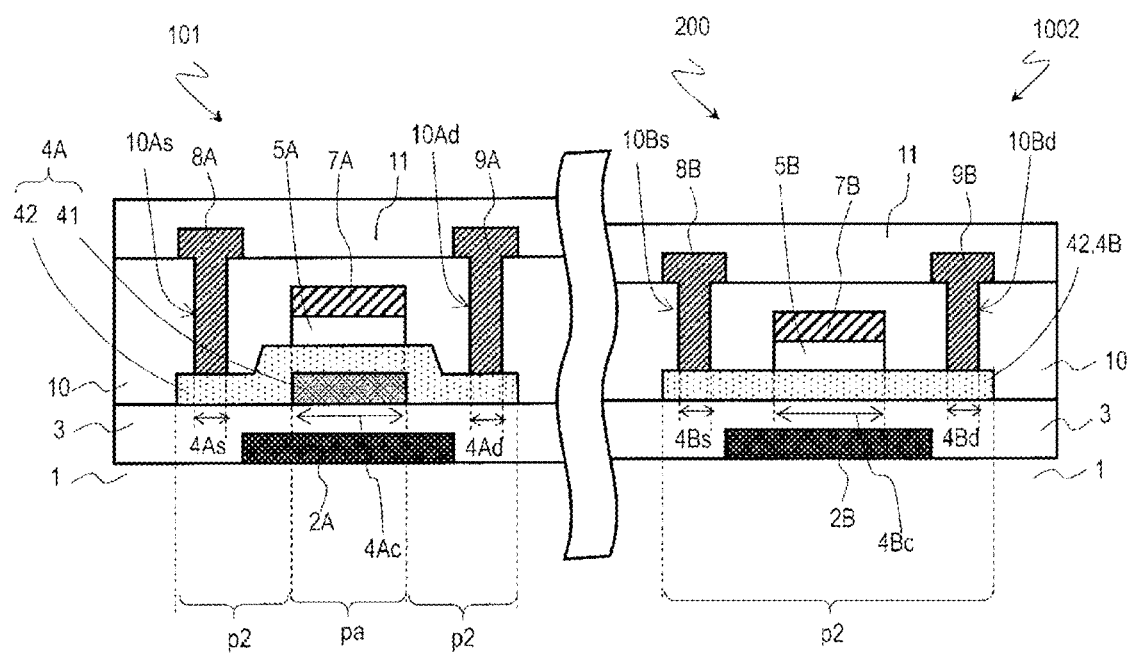
FIG. 10A is a schematic cross-sectional view illustrating a first TFT 101 and the second TFT 200 in an active matrix substrate 1002 of a modification example 2.
Figure 10B:
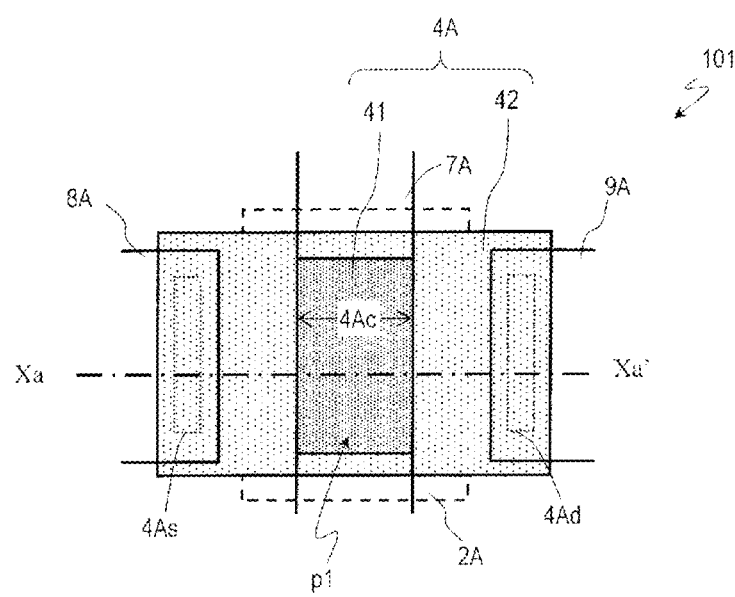
FIG. 10B is a schematic plan view of the TFT 101.

FIG. 10A is a schematic cross-sectional view illustrating a first TFT 101 and the second TFT 200 in an active matrix substrate 1002 of a modification example 2 according to the present embodiment. FIG. 10B is a schematic plan view of the TFT 101. The cross section of the TFT 101 illustrated in FIG. 10A is a cross section taken along a line Xa-Xa' of FIG. 10B.

The active matrix substrate 1002 is different from the active matrix substrate 1000 of the above-described embodiment in that the first TFT 101 has an active layer structure including the layered portion pa and the upper layer portion p2. Note that the second TFT 200 has an active layer structure similar to that of TFT 200 illustrated in FIG. 2.

In the TFT 101, the oxide semiconductor layer 4A includes the upper layer portion p2 including the low mobility oxide semiconductor film 42 and not including the high mobility oxide semiconductor film 41, and a layered portion pa including the high mobility oxide semiconductor film 41 and the low mobility oxide semiconductor film 42. At least a part of the first region 4Ac of the oxide semiconductor layer 4A is the layered portion pa. Both the first contact region 4As and the second contact region 4Ad are upper layer portions p2.

In the illustrated example, the high mobility oxide semiconductor film 41 is arranged so as to be located in at least a part of the first region 4Ac. The low mobility oxide semiconductor film 42 is one size larger than the high mobility oxide semiconductor film 41 and is arranged so as to cover the upper face and the side surface of the high mobility oxide semiconductor film 41. Here, the entire side surface of the high mobility oxide semiconductor film 41 is covered with the low mobility oxide semiconductor film 42. Note that a part of the high mobility oxide semiconductor film 41 may not be covered with the low mobility oxide semiconductor film 42. The structure of the oxide semiconductor layer 4A other than the active layer is similar to the structure of the TFT 100 of the embodiment described above.

According to the modification example, in the oxide semiconductor layer 4A, the high mobility oxide semiconductor film 41 is arranged in a portion serving as a channel, and the size of the high mobility oxide semiconductor film 41 is made smaller than that of the low mobility oxide semiconductor film 42. As a result, the depletion of the TFT 101 is less likely to occur while maintaining a high mobility.

Figure 11A:
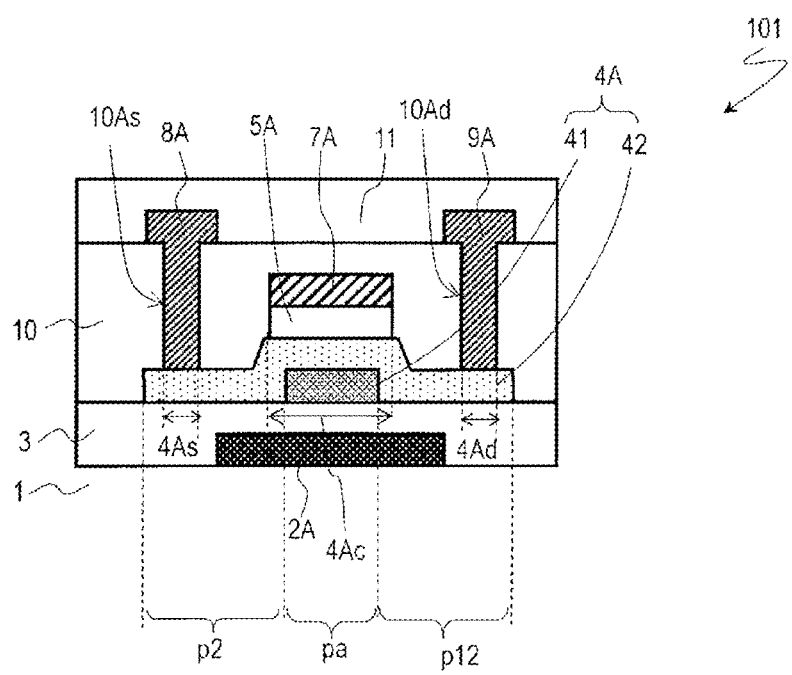
FIG. 11A is a cross-sectional view illustrating another example of the TFT 101.
Figure 11B:
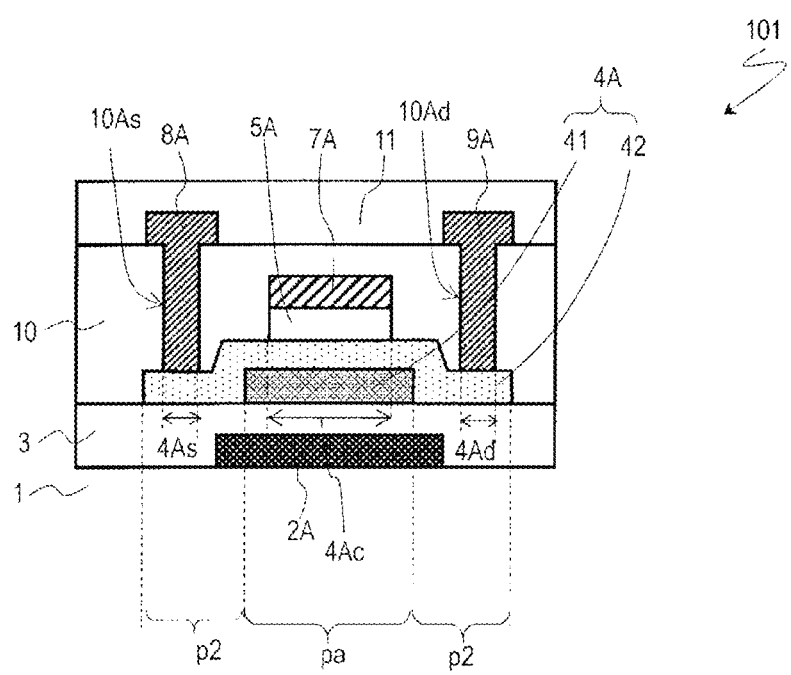
FIG. 11B is a cross-sectional view illustrating still another example of the TFT 101.

In the TFT 101, as illustrated in FIG. 11A, the high mobility oxide semiconductor film 41 may be arranged only in a part of the first region 4Ac. In other words, in the first region 4Ac, the layered portion pa and the upper layer portion p2 may be provided. In this case, the width of the high mobility oxide semiconductor film 41 in the channel length direction may be smaller than the width of the first region 4Ac (that is, the width of the gate electrode 7A). Alternatively, as illustrated in FIG. 11B, the width of the high mobility oxide semiconductor film 41 in the channel length direction is equal to or larger than the width of the first region 4Ac (that is, the width of the gate electrode 7A), and in the entire first region 4Ac, the layered portion pa may be provided.

Figure 12:
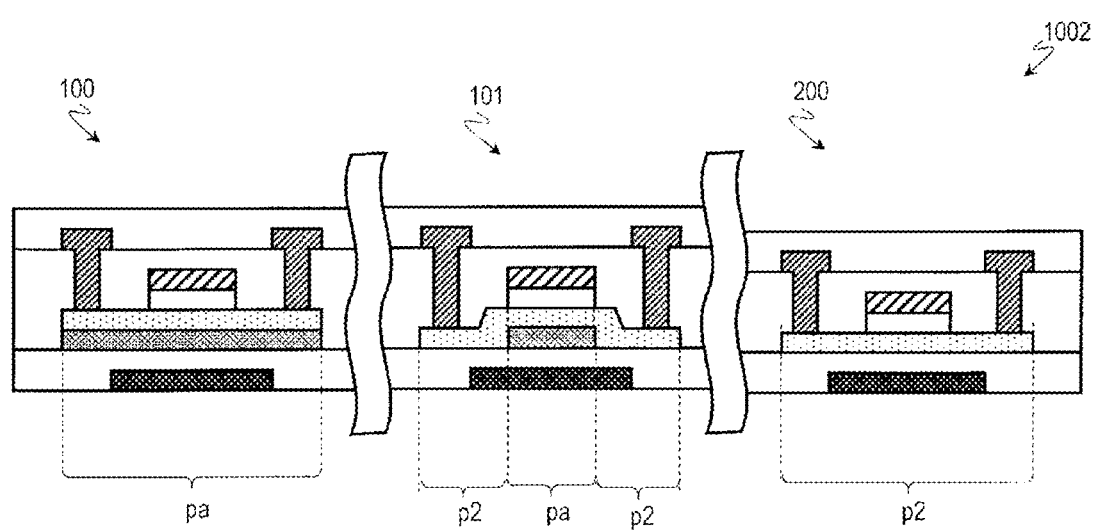
FIG. 12 is a cross-sectional view illustrating another example of the active matrix substrate 1002.

FIG. 12 is a cross-sectional view illustrating another active matrix substrate 1002 of the modification example. As illustrated in FIG. 12, the active matrix substrate 1002 may include at least three TFTs 100, 101, and 200 having different active layer structures. Note that in the description, when the active matrix substrate includes two first TFTs (or two second TFTs) having different active layer structures, one of them may be referred to as a "third TFT".

Next, a manufacturing method of the active matrix substrate 1002 of the modification example will be described.

FIGS. 13A to 13F are process cross-sectional views for explaining an example of the manufacturing method of the active matrix substrate 1002 of the modification example, respectively. Here, an example is illustrated in which the first circuit transistor Tc1 and the second circuit transistor Tc2 are formed in the non-display region FR, and the pixel transistor Tp is formed in each of the pixel areas PIX in the display region DR. The first circuit transistor Tc1 is the first TFT 101 and is used in, for example, an SSD circuit. The second circuit transistor Tc2 is the second TFT 200, and is used in, for example, a drive circuit. The pixel transistor Tp is the second TFT 200. The regions forming the first circuit transistor Tc1, the second circuit transistor Tc2, and the pixel transistor Tp are designated as TFT formation regions Rc1, Rc2, and Rp, respectively. Hereinafter, the points different from the manufacturing method of the active matrix substrate 1000 will be mainly described, and the description of the same steps will be omitted.

Figure 13A:
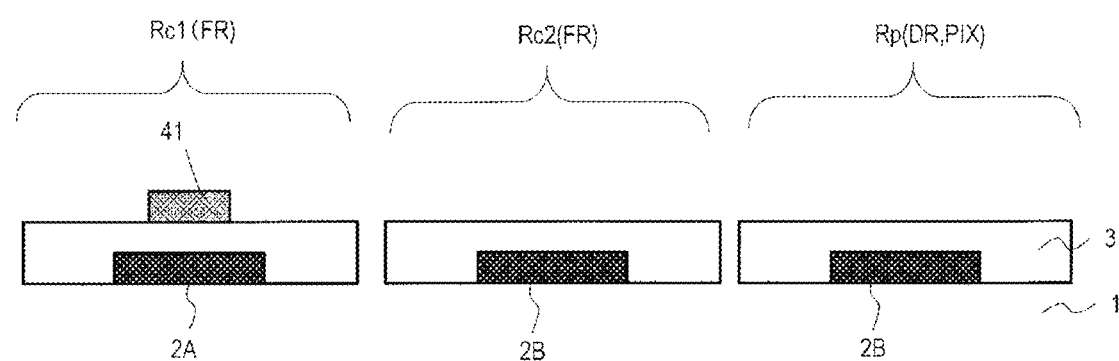
FIG. 13A is a process cross-sectional view illustrating a manufacturing method of the active matrix substrate 1002.

First, the lower conductive layers 2A and 2B and the lower insulating layer 3 are formed in the same manner as the active matrix substrate 1000. Subsequently, as illustrated in FIG. 13A, the high mobility oxide semiconductor film 41 is formed and patterned on the lower insulating layer 3. In this way, the high mobility oxide semiconductor film 41 is arranged only in a part of the region to be the oxide semiconductor layer (active layer) in the TFT formation region Rc1. In the high mobility oxide semiconductor 41, a portion located in the TFT formation regions Rc2 and Rp is removed.

Figure 13B:
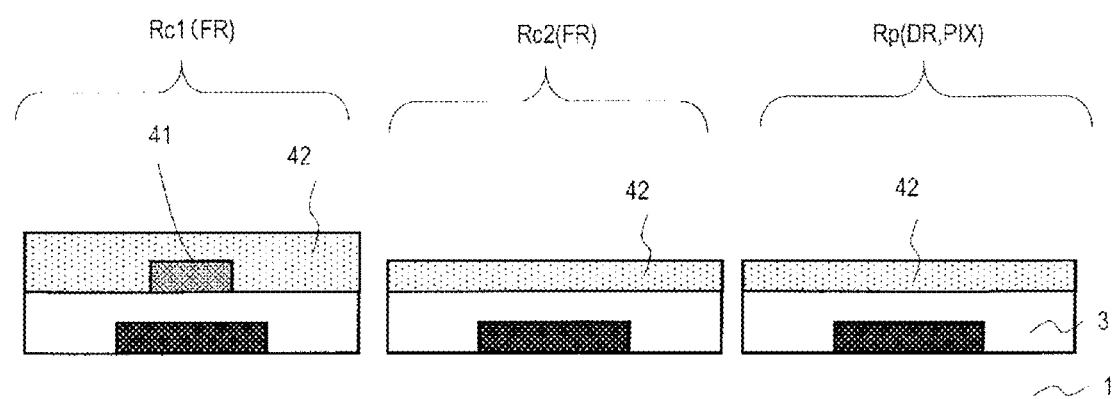
FIG. 13B is a process cross-sectional view illustrating the manufacturing method of the active matrix substrate 1002.
Figure 13C:
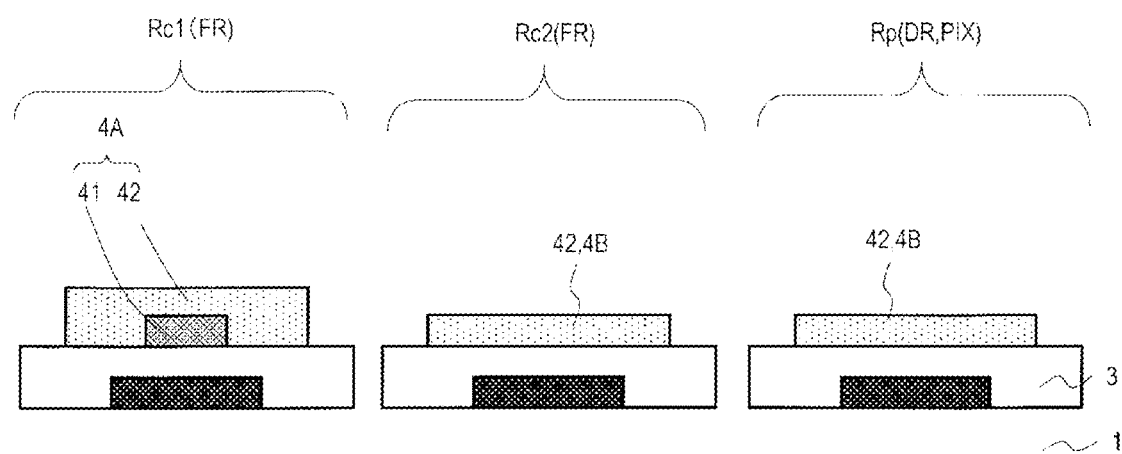
FIG. 13C is a process cross-sectional view illustrating the manufacturing method of the active matrix substrate 1002.

Subsequently, as illustrated in FIG. 13B, the low mobility oxide semiconductor film 42 is formed so as to cover the high mobility oxide semiconductor film 41 and the lower insulating layer 3. Thereafter, as illustrated in FIG. 13C, the low mobility oxide semiconductor film 42 is patterned. As a result, the oxide semiconductor layer 4A including the high mobility oxide semiconductor film 41 and the low mobility oxide semiconductor film 42 covering the upper face and the side surface of the high mobility oxide semiconductor film 41 is obtained in the TFT formation region Rc1. The oxide semiconductor layer 4B including the low mobility oxide semiconductor film 42 and not including the high mobility oxide semiconductor film 41 is obtained in the TFT formation regions Rc2 and Rp.

Figure 13D:
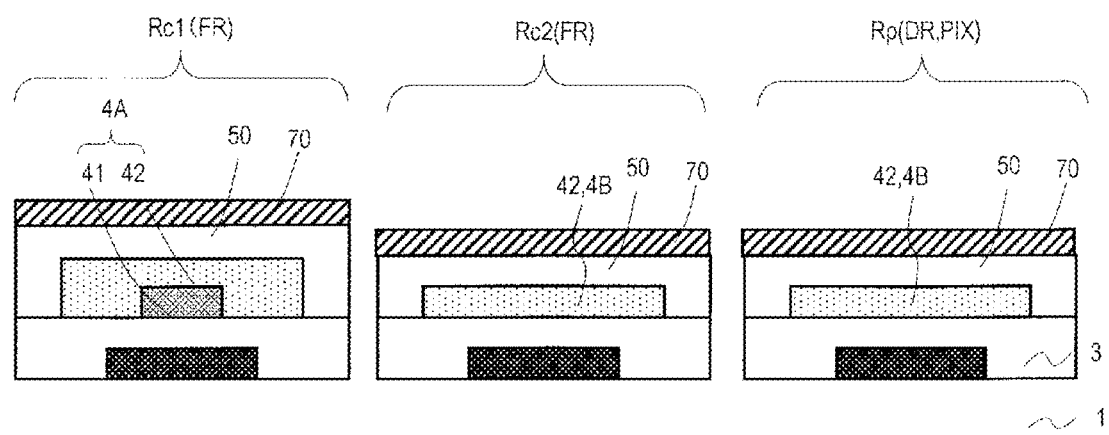
FIG. 13D is a process cross-sectional view illustrating the manufacturing method of the active matrix substrate 1002.
Figure 13E:
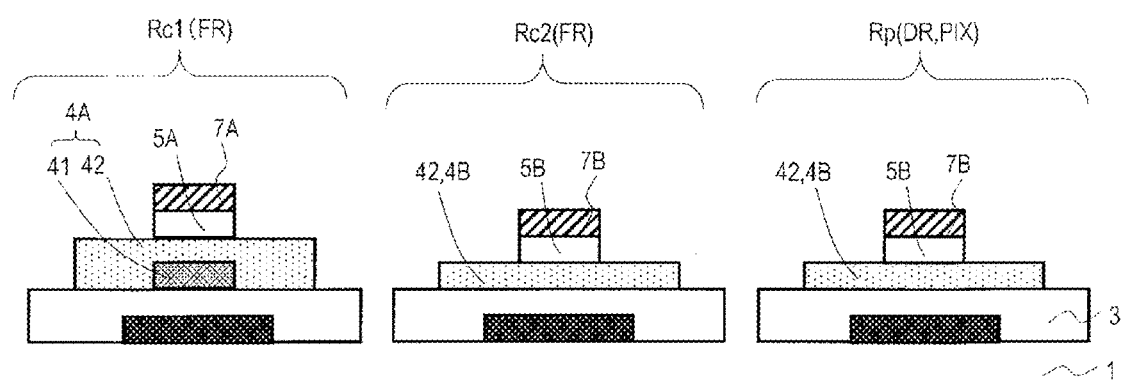
FIG. 13E is a process cross-sectional view illustrating the manufacturing method of the active matrix substrate 1002.
Figure 13F:
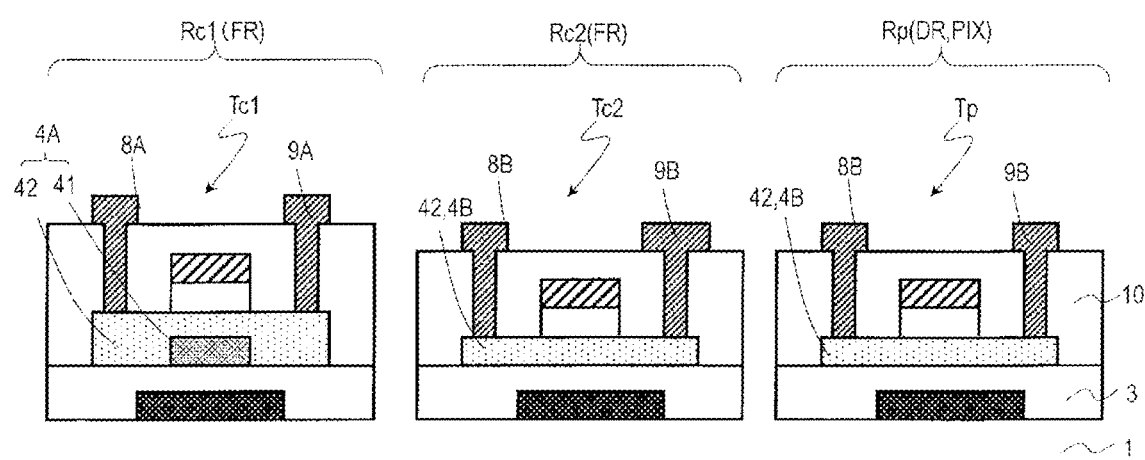
FIG. 13F is a process cross-sectional view illustrating the manufacturing method of the active matrix substrate 1002.

Subsequently, as illustrated in FIGS. 13D to 13F, the gate insulating layers 5A and 5B, the gate electrodes 7A and 7B, the interlayer insulating layer 10, the source electrodes 8A and 8B, and the drain electrodes 9A and 9B are formed in the same manner as in the active matrix substrate 1000. In this way, the first circuit transistor Tc1 is formed in the TFT formation region Rc1, and the second circuit transistor Tc2 is formed in the TFT formation region Rc2. In addition, the pixel transistor Tp is formed in the TFT formation region Rp in each pixel area.

Modification Example 3

An active matrix substrate of a modification example 3 is different from the active matrix substrate 1000 in that in the first region of the second TFT, the lower layer portion p1 including the high mobility oxide semiconductor film 41 and not including the low mobility oxide semiconductor film 42 is provided.

Figure 14A:
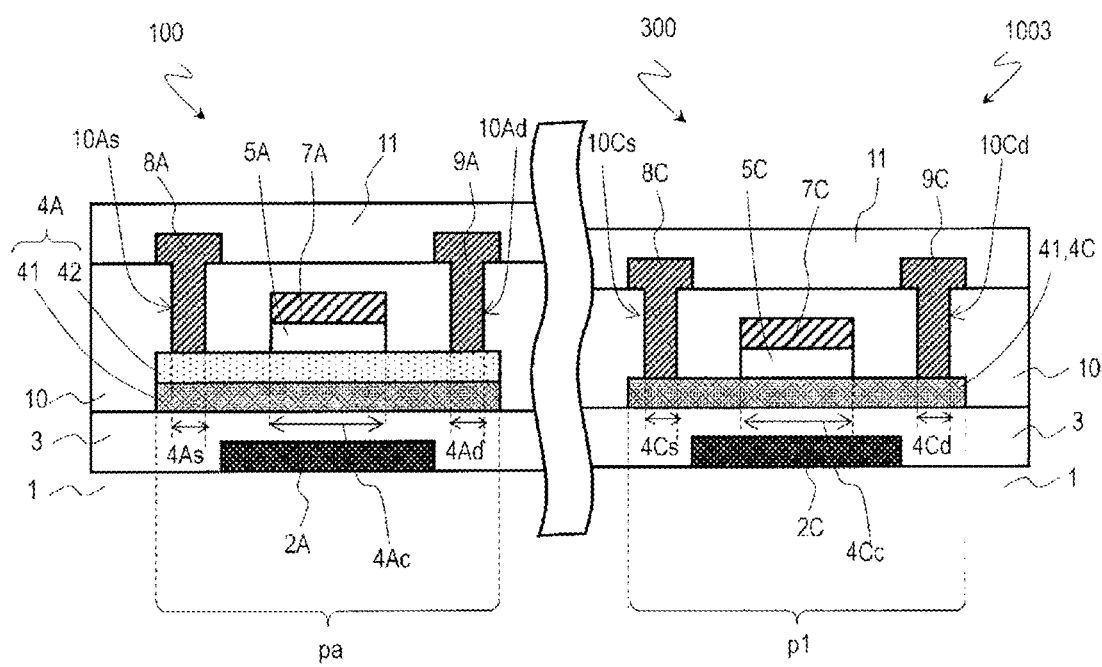
FIG. 14A is a schematic cross-sectional view illustrating the first TFT 100 and a second TFT 300 in an active matrix substrate 1003 of a modification example 3.

FIG. 14A is a schematic cross-sectional view of the first TFT 100 and a second TFT 300 in an active matrix substrate 1003 of the modification example 3. Hereinafter, regarding the configuration of the active matrix substrate 1003, only the points different from the active matrix substrate 1000 will be described, and the description of the same configuration will be omitted.

The TFT 100 has a similar structure to the TFT 100 illustrated in FIG. 2.

Similar to the TFT 100, the TFT 300 includes an oxide semiconductor layer 4C, a gate electrode 7C arranged on a part of the oxide semiconductor layer 4C with a gate insulating layer 5C interposed therebetween, and a source electrode 8C and a drain electrode 9C. The TFT 300 may further include a lower conductive layer 2C on the substrate 1 side of the oxide semiconductor layer 4C.

The oxide semiconductor layer 4C includes the lower layer portion p1 including the high mobility oxide semiconductor film 41 but not including the low mobility oxide semiconductor film 42. As illustrated in the figure, the entire oxide semiconductor layer 4C may include the high mobility oxide semiconductor film 41 and may not include the low mobility oxide semiconductor film 42. Note that in the modification example, the lower layer portion p1 may be provided over an entire first region 4Cc of the oxide semiconductor layer 4C, and the low mobility oxide semiconductor film 42 may be provided in a second region.

Figure 14B:
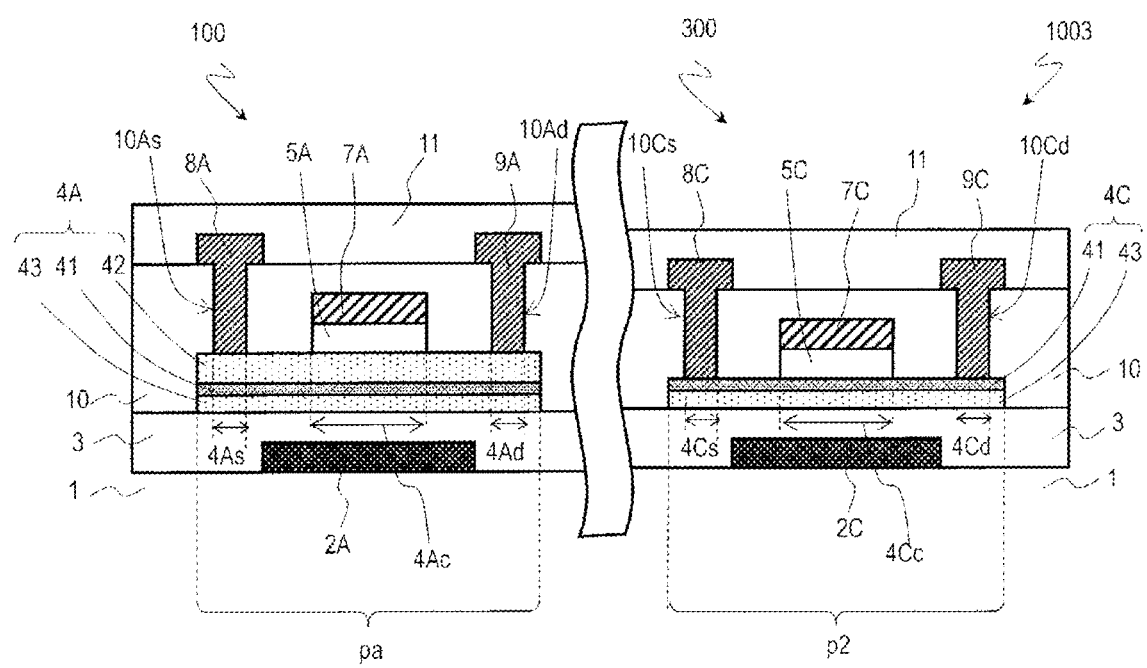
FIG. 14B is a cross-sectional view illustrating another example of the active matrix substrate 1003 of the modification example 3.

Each of the oxide semiconductor layers 4A and 4C may further include an oxide semiconductor film other than the high mobility oxide semiconductor film 41 and the low mobility oxide semiconductor film 42. For example, as illustrated in FIG. 14B, each of the oxide semiconductor layers 4A and 4C may further include another oxide semiconductor film 43 having a lower mobility than the high mobility oxide semiconductor film 41 between the high mobility oxide semiconductor film 41 and the substrate 1. As the other oxide semiconductor film 43, for example, a low mobility oxide semiconductor film having a similar composition to the low mobility oxide semiconductor film 42 may be used. The thickness of the other oxide semiconductor film 43 is the same as that illustrated in FIG. 4, and may be, for example, 5 nm or more and 30 nm or less.

Figure 15:
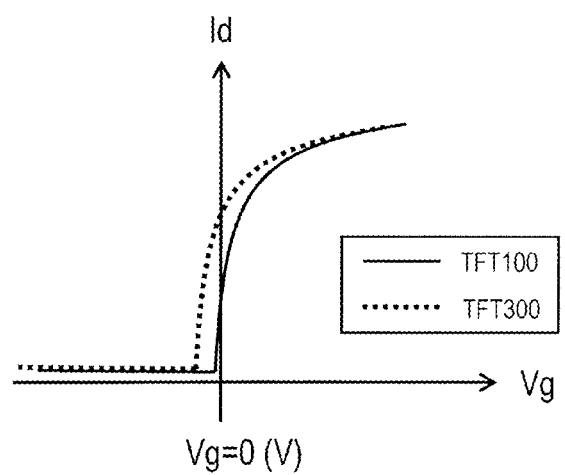
FIG. 15 is a diagram illustrating Vg-Id characteristics of the TFT 100 and the TFT 300.

FIG. 15 is a diagram illustrating Vg-Id characteristics of the TFT 100 and the TFT 300. The horizontal axis of the graph represents a gate-drain voltage Vg, and the vertical axis of the graph represents a drain current Id.

From FIG. 15 it can be seen that the TFT 300 has a lower threshold voltage than the TFT 100. This is because in TFT 300, in the first region 4Cc of the oxide semiconductor layer 4C, the low mobility oxide semiconductor film 42 is not provided, so that the mobility in the entire first region is higher than that of the oxide semiconductor layer 4A including the low mobility oxide semiconductor film 42, and the threshold voltage has shifted in the negative direction.

The TFT 100 may be used as a drive circuit TFT, and the TFT 300 may be used as an SSD circuit TFT. It is advantageous to use the TFT 300 in, for example, an SSD circuit because the on current can be increased. The TFT 300 may have depletion characteristics that the threshold voltage is negative. As a result, the on current of the TFT 300 can be further improved.

Alternatively, the TFT 100 and the TFT 300 may be mixed in the drive circuit. For example, the TFT 300 may be used as an output transistor in a gate drive circuit, and the TFT 100 may be used as another transistor.

Figure 16:
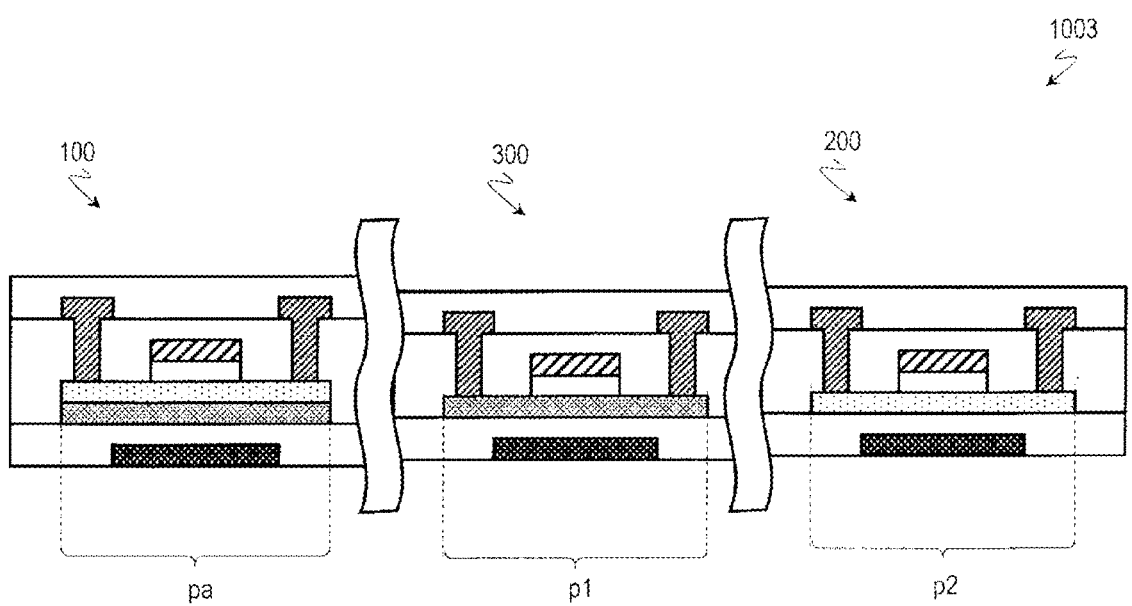
FIG. 16 is a cross-sectional view illustrating another example of the active matrix substrate 1003.

FIG. 16 is a cross-sectional view illustrating another active matrix substrate 1003 of the modification example. As illustrated in FIG. 16, the active matrix substrate 1003 may include at least three TFTs 100, 200, and 300 having different active layer structures.

Configuration and Operation of Gate Drive Circuit

A circuit configuration and operation of the gate driver monolithically formed in the active matrix substrate will be described. The gate driver includes a shift register. The shift register includes a plurality of unit shift register circuits connected in multiple stages.

Figure 17:
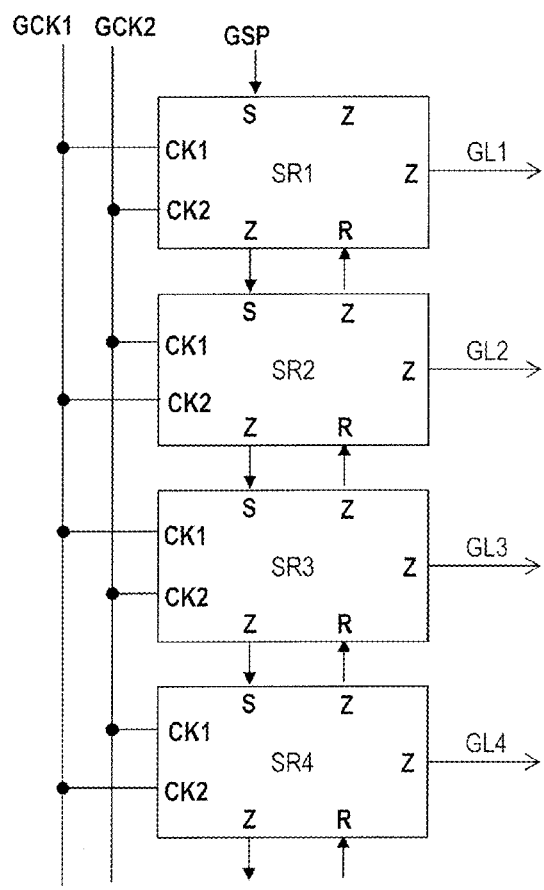
FIG. 17 is a diagram illustrating a shift register circuit in a gate drive circuit.

FIG. 17 is a diagram illustrating the shift register circuit.

The shift register circuit includes a plurality of unit shift register circuits SR1 to SRz (z is an integer of 2 or more) (hereinafter, collectively referred to as "unit shift register circuit SR"). The unit shift register circuit SR in each stage includes a set terminal S that receives a set signal, an output terminal Z that outputs an output signal, a reset terminal R that receives a reset signal, and clock input terminals CK1 and CK2 that receive clock signals GCK1 and GCK2. In the unit shift register circuit SRα (α≥2), the output signal of the unit shift register circuit SR in the previous stage is inputted to the set terminal S. The set terminal S of the unit shift register circuit SR1 in the first stage receives a gate start pulse signal GSP. The unit shift register circuit SR in each stage also outputs the output signal to a corresponding gate bus line GL arranged in the display region. The reset terminal R receives an output signal from the unit shift register circuit in the next stage. The reset terminal R of the unit shift register circuit SRz in the final stage receives a clear signal.

The two clock input terminals receive two-phase clock signals GCK1 and GCK2, respectively. One of the clock input terminals receives the clock signal GCK1, and the other of the clock input terminals receives the clock signal GCK2. The clock signals to be inputted to the respective clock input terminals are configured to be alternately switched between adjacent stages.

Figure 18:
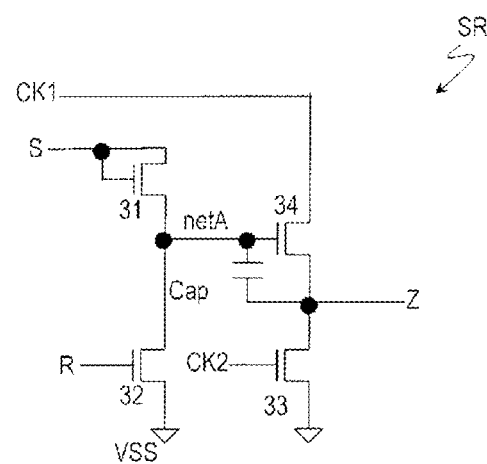
FIG. 18 is a diagram illustrating a unit shift register circuit SR.

FIG. 18 is a diagram illustrating an example of the unit shift register circuit SR. In the example, the unit shift register circuit SR includes four TFTs 31 to 34 and a capacitance portion Cap.

The TFT 31 is an input transistor. A gate and a drain of the TFT 31 are connected to the set terminal, and a source of the TFT 31 is connected to a gate of the TFT 34. The TFT 34 is an output transistor. A drain of the TFT 34 is connected to the clock input terminal CK1, and a source of the TFT 34 is connected to the output terminal Z. That is, the TFT 34 serves as a transmission gate to pass and block the clock signal to be inputted to the clock input terminal CK1.

The capacitance portion Cap is connected between the gate and the source of the TFT 34 being the output transistor. In the description, a node connected to the gate of the TFT 34 is referred to as a "node netA" and a node connected to the output terminal Z is referred to as a "node Z". One electrode of the capacitance portion Cap is connected to the gate of the TFT 34 and the node netA, and another electrode is connected to the source of the TFT 34 and the node Z.

The TFT 32 is arranged between a low power supply input terminal and the node netA. The TFT 32 serves as a pull-down transistor to reduce a potential at the node netA. A gate of the TFT 32 is connected to the reset terminal, a drain of the TFT 32 is connected to the node netA, and a source of the TFT 32 is connected to the low power supply input terminal.

The TFT 33 is connected to the node Z. A gate of the TFT 33 is connected to the input terminal of the clock signal CK2, a drain of the TFT 33 is connected to the node Z, and a source of the TFT 33 is connected to the low power supply input terminal.

In the present embodiment, the second TFT may be used as the TFTs 31 to 34. Alternatively, the first TFT having large current driving force (high mobility) may be used at least as the output transistor TFT 34, and the second TFT may be used as the other TFTs. As a result, two types of TFTs having different characteristics can be mixed in the drive circuit depending on the use. In addition, regardless of the respective TFT structures, any one of the TFTs 31 to 34 preferably has enhancement characteristics.

Note that the configuration of the drive circuit is not limited to the illustrated configuration. For example, the unit shift register circuit may have five or more TFTs including an output transistor.

Configuration and Operation of SSD Circuit

A circuit configuration and operation of the SSD monolithically formed in the active matrix substrate will be described.

Figure 19:
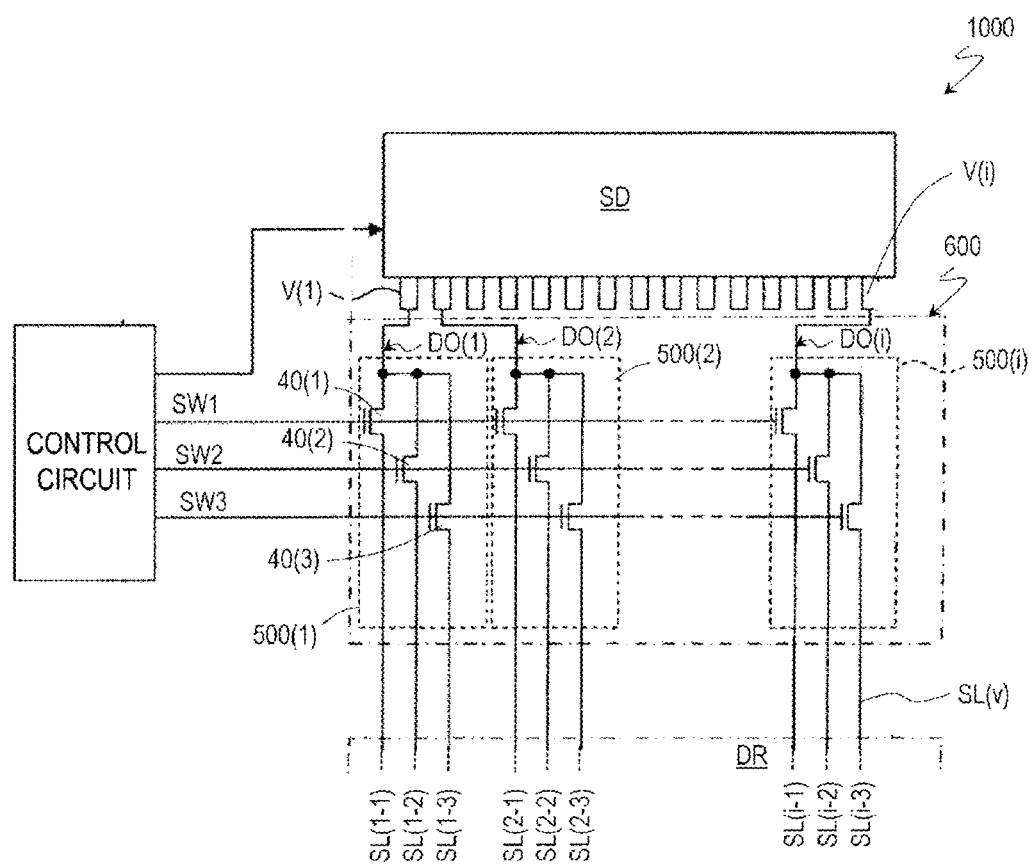
FIG. 19 is a diagram illustrating an SSD circuit.

FIG. 19 is a diagram for explaining the configuration and operation of the SSD circuit.

An SSD circuit 600 is arranged between the source driver SD and the display region DR. The SSD circuit 600 includes a plurality of SSD unit circuits 500(1) to 500(*i*) (i is an integer of 2 or more) (collectively referred to as "SSD unit circuit 500" in some cases) and control signal trunk lines SW1 to SWn (n is an integer of 2 or more, here n=3). The SSD circuit 600 and the source driver SD are controlled by a control circuit provided in the non-display region FR. The control signal trunk lines SW1 to SWn are connected to the control circuit.

Each of output terminals V(1) to V(i) of the source driver SD (hereafter, collectively referred to as "V terminal" in some cases) is connected to one of a plurality of video signal lines DO(1) to DO(i) (collectively referred to as "video signal line DO" in some cases). A grouped n source bus lines SL are associated with one video signal line DO. For each video signal line, the SSD unit circuit 500 is provided between the video signal line DO and the grouped source bus lines SL. The SSD unit circuit 500 distributes video data from one video signal line DO to the n source bus lines SL.

In the present embodiment, the N-th video signal line among the plurality of video signal lines DO(1) to DO(i) is designated as DO(N) (N is an integer from 1 to i), and the SSD unit circuit 500 and the source bus lines SL associated with the video signal line DO(N) are designated as 500(N) and SL(N−1) to SL(N−n), respectively. The source bus lines SL(N−1) to SL(N−n) may be associated, for example, with R, G, and B pixels (i.e., n=3).

Each SSD unit circuit 500(N) includes at least n (here, three) thin film transistors (SSD circuit TFTs) 40(1) to 40(n) (which may be collectively referred to as "SSD circuit TFT 40").

The SSD circuit TFT 40 functions as a selection switch. A gate electrode of the SSD circuit TFT 40 is electrically connected to corresponding one among the n control signal trunk lines SW1 to SWn. A source electrode of the SSD circuit TFT 40 is electrically connected to a branch wiring line of the video signal line DO(N). A drain electrode of the SSD circuit TFT 40 is connected to one among the corresponding source bus lines SL(N−1) to SL(N−3).

A selection signal (control signal) is supplied to the gate electrode of the SSD circuit TFT 40 from one of the control signal trunk lines SW1 to SW3. The control signal defines an on period of the selection switch within the same group and is synchronized with the time-sequential signal outputted from the source driver SD. The SSD unit circuit 500(N) writes the data potentials obtained by time-dividing the output of the video signal line DO(N) to the plurality of source bus lines from SL(N−1) to SL(N−n) (time division drive) time-sequentially. As a result, the number of V terminals of the source driver SD can be reduced, so that the area of the non-display region FR can be further reduced (the frame can be narrowed).

In the present embodiment, as the SSD circuit TFT 40, a TFT having a higher mobility than other circuit TFTs or pixel TFTs, that is, a TFT having larger current driving force can be used. For example, the first TFT or the third TFT having a high mobility can be suitably applied as the SSD circuit TFT 40. The first TFT 100 may have depletion characteristics.

Note that the configuration of the SSD circuit is not limited to the illustrated configuration. The configuration, operation, and the like of the SSD circuit are disclosed in JP 2008-225036 A, JP 2006-119404 A, WO 2011/118079, and the like. In the description, the entire contents of the disclosures of JP 2008-225036 A, JP 2006-119404 A, and WO 2011/118079 are incorporated herein by reference.

Second Embodiment

An active matrix substrate of a second embodiment is different from the above-described embodiment in that in each pixel area, a plurality of TFTs having different active layer structures are provided. Hereinafter, the active matrix substrate of the present embodiment will be described by taking an active matrix substrate used in an organic EL display device as an example. Note that, in the following, the points different from the active matrix substrate according to the first embodiment will be mainly described, and the description of the same structure will be omitted.

Figure 20:
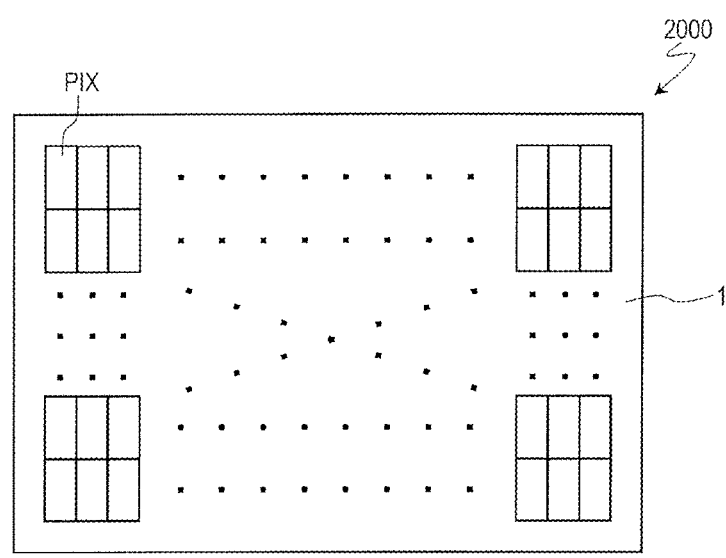
FIG. 20 is a schematic diagram illustrating an example of a planar structure of an active matrix substrate 2000 according to a second embodiment.

FIG. 20 is a schematic view illustrating an example of a planar structure of an active matrix substrate 2000 according to the present embodiment.

The active matrix substrate 2000 includes a plurality of pixel areas PIX arranged in a matrix. The plurality of pixel areas PIX typically include pixel areas corresponding to red pixels that display red, green pixels that display green, and blue pixels that display blue.

Figure 21:
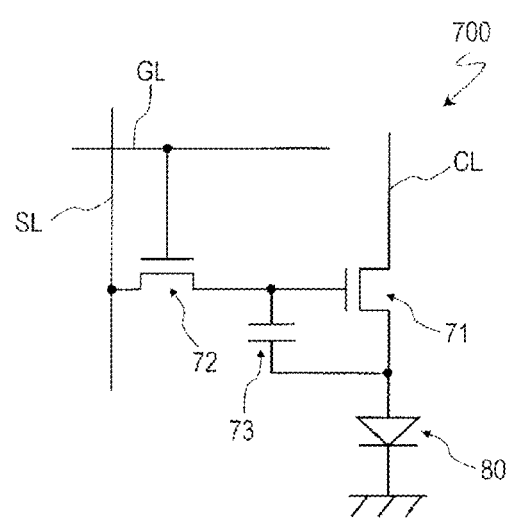
FIG. 21 is a diagram illustrating a pixel circuit.

Each of the plurality of pixel areas PIX includes the substrate 1 and a pixel circuit (not illustrated in FIG. 10) provided on the substrate 1. FIG. 21 illustrates an example of the pixel circuit.

A pixel circuit 700 illustrated in FIG. 21 includes a drive TFT 71, a selection TFT 72, and a capacitance element (holding capacitor) 73. The drive TFT 71 and the selection TFT 72 are oxide semiconductor TFTs supported on the substrate 1, respectively.

A gate electrode of the selection TFT 72 is connected to the gate bus line GL. A source electrode of the selection TFT 72 is connected to the source bus line SL. A drain electrode of the selection TFT 72 is connected to a gate electrode of the drive TFT 71 and the capacitance element 73. A source electrode of the drive TFT 71 is connected to a current supply line CL. A drain electrode of the drive TFT 71 is connected to an organic light emitting diode (OLED) 80 formed on the active matrix substrate 2000.

When an on signal is supplied from the gate bus line GL to the gate electrode of the selection TFT 72, the selection TFT 72 is brought into an on state, and thus a signal voltage from the source bus line SL (corresponding to desired light emission luminance of the OLED 80) is applied to the capacitance element 73 and the gate electrode of the drive TFT 71 via the selection TFT 72. When the drive TFT 71 is brought into the on state by the signal voltage, a current from the current supply line CL flows through the drive TFT 71 to the OLED 80, and then the OLED 80 emits light.

According to the present embodiment, a plurality of oxide semiconductor TFTs (here, the drive TFT 71 and the selection TFT 72) having different required characteristics can be produced separately in the pixel circuit 700. Specifically, the first TFT may be used as the selection TFT 72, and the second TFT having a lower mobility (having the threshold voltage shifted in the positive direction) than the selection TFT 72 may be used as the drive TFT 71.

Figure 22:
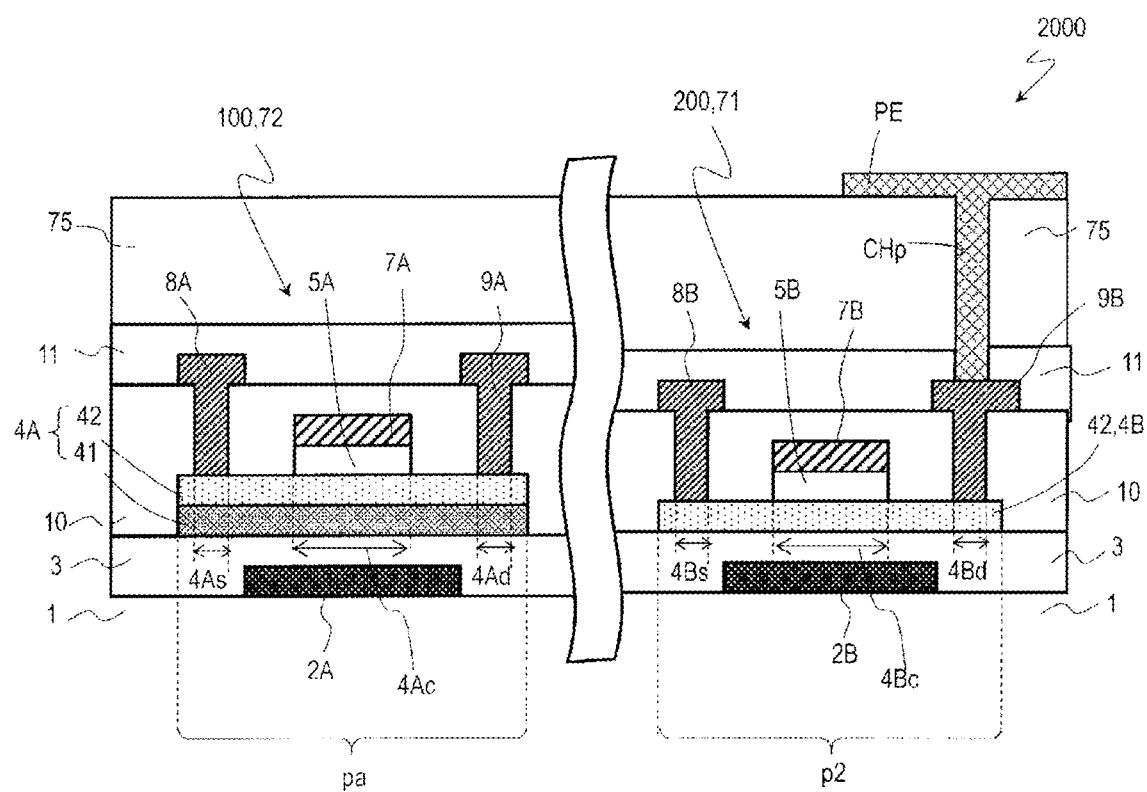
FIG. 22 is a cross-sectional view illustrating the first TFT 100 and the second TFT 200 in the active matrix substrate 2000.

FIG. 22 is a cross-sectional view illustrating the first TFT 100 and the second TFT 200 in the active matrix substrate 2000. Here, an example is illustrated in which the second TFT 200 is used as the drive TFT 71 of the pixel circuit 700, the first TFT 100 is used as the selection TFT 72, and the second TFT 200 is used as the drive circuit TFT.

The structures of the first TFT 100 and the second TFT 200 are similar to those described above with reference to FIG. 2. However, when applied to a top-emitting organic EL display device, the lower conductive layers 2A and 2B may not be formed as light blocking layers in the respective TFTs. Alternatively, in the first TFT 100, the lower conductive layer 2A may function as a lower gate electrode (double gate structure), and in the second TFT 200, the lower conductive layer 2B may not be provided.

A flattened layer 75 is provided on the drive TFT 71 and the selection TFT 72. A pixel electrode PE is provided on the flattened layer 75. The drain electrode 9B of the drive TFT 71 is electrically connected to the pixel electrode PE. Note that when applied to a color filter organic EL display device, a color filter layer (not illustrated) is further provided between the flattened layer 75 and the inorganic insulating layer 11. A bank (not illustrated) formed of an insulating material is provided between adjacent pixel areas on the flattened layer 75 and the pixel electrode PE. Further, although not illustrated, an organic EL layer is arranged on the pixel electrode PE, and an upper electrode is provided on the organic EL layer. For example, the pixel electrode PE functions as an anode electrode and the upper electrode functions as a cathode electrode.

Note that the configuration of the pixel circuit is not limited to the configuration illustrated in FIG. 21. Each pixel circuit may have three or more TFTs. Even in this case, at least the second TFT 200 may be used as the drive TFT 71 and for other TFTs, the first TFT 100 or the second TFT 200 may be used depending on the use.

Also in the present embodiment, as described with reference to FIG. 8, one or both of the source electrode and the drain electrode of the first TFT 100 and/or the second TFT may be formed in the same layer as the lower conductive layer. In this case, in the second TFT 200, the contact resistance may be reduced by arranging the high mobility oxide semiconductor film 41 at the connection portion between the oxide semiconductor layer 4B and the electrode located in the same layer as the lower conductive layer. Such a structure is suitably applied to, for example, an active matrix substrate having a lower source wiring line structure.

The compositions, thicknesses, and the like of the high mobility oxide semiconductor film 41 and the low mobility oxide semiconductor film 42 may be the same as those in the aforementioned embodiment. However, in the present embodiment, it is preferable that an S value of the second TFT 200 used as the drive TFT 71 be large (that is, the V-I characteristic is gentle). Thus, the low mobility oxide semiconductor film 42 may have a lower mobility than that of the aforementioned embodiment. Further, the S value can be further increased by increasing a channel length L in the drive TFT 71.

Although not illustrated in the figure, a gate drive circuit may be monolithically formed in the non-display region of the active matrix substrate 2000. In this case, the second TFT 200 can be used as the drive circuit TFT. It is also possible to mix TFTs having different characteristics in the gate drive circuit depending on the use. For example, the first TFT 100 may be used at least as an output transistor, and the second TFT 200 may be used in the other drive circuit TFTs.

Figure 23:
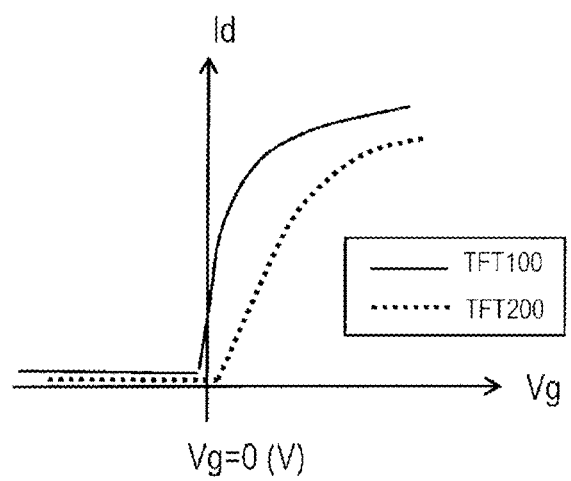
FIG. 23 is a diagram illustrating Vg-Id characteristics of the first TFT 100 and the second TFT 200.

FIG. 23 is a diagram illustrating Vg-Id characteristics of the first TFT 100 and the second TFT 200 in the present embodiment. The horizontal axis of the graph represents the potential of a gate electrode based on the potential of the drain electrode (gate-drain voltage) Vg, and the vertical axis of the graph represents a drain current Id.

From FIG. 23, it can be seen that the threshold voltage of the second TFT 200 is shifted in a positive direction from the threshold voltage of the first TFT 100. In this example, the second TFT 200 has enhancement characteristics that the threshold voltage is positive, and the first TFT 100 has depletion characteristics that the threshold voltage is negative. Further, the V-I characteristic of the second TFT 200 is gentler than that of the first TFT 100. That is, the S value of the second TFT 200 is larger than that of the first TFT 100. Note that the positive/negative and magnitude of the threshold voltage and the slope of the V-I characteristic of each TFT, and the like are not limited to the illustrated examples.

Since the second TFT 200 has a large S value, the second TFT 200 is suitably used as the drive TFT in the pixel circuit. As a result, the multi-gray scale display can be suitably performed. Additionally, as illustrated in the figure, when the second TFT 200 has the enhancement characteristics, the second TFT 200 may be suitably used for some circuit TFTs such as a drive circuit TFT. As a result, circuit malfunction can be suppressed, thereby reducing yield loss.

On the other hand, the first TFT 100 has large current driving force (on current). In addition, a channel can be shortened, thereby reducing a circuit area. The first TFT 100 is suitably used as a selection TFT in a pixel circuit, for example. As a result, the second TFT 200 can be applied to high frequency or high definition models. Further, the first TFT 100 may also be used as the output transistor in the gate drive circuit.

Table 2 illustrates suitable characteristics of the drive TFT and the selection TFT in the pixel circuit and the drive circuit TFT for the organic EL display devices. The characteristics and numerical ranges set forth in Table 2 are examples, and are not limited to the characteristics of each TFT.

TABLE 2

| Use of TFT | Drive TFT in pixel circuit | Selection TFT in pixel circuit | Output transistor in drive circuit |
|---|---|---|---|
| Threshold voltage | Enhancement 1 V or more | Depletion to enhancement −1 V or more | Enhancement 0 V or more |
| Mobility | Low to medium 10 cm$^2$/Vs or less | High 20 cm$^2$/Vs or more | High 20 cm$^2$/Vs or more |
| S value | Large | Small | Small |
| TFT structure | TFT 200 | TFT 100 | TFT 100 |

Oxide Semiconductor

The oxide semiconductor included in the oxide semiconductor layer of each TFT according to the present embodiment may be an amorphous oxide semiconductor or a crystalline oxide semiconductor including a crystalline portion. Examples of the crystalline oxide semiconductor include a polycrystalline oxide semiconductor, a microcrystalline oxide semiconductor, and a crystalline oxide semiconductor having a c-axis oriented substantially perpendicular to the layer surface.

The oxide semiconductor layer may have a layered structure including two or more layers. When the oxide semiconductor layer has the layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. The oxide semiconductor layer may include a plurality of amorphous oxide semiconductor layers. In a case where the oxide semiconductor layer has a dual-layer structure including an upper layer and a lower layer, an energy gap of the oxide semiconductor included in a layer positioned on the gate electrode side of the dual-structure (that is the lower layer in the case of the bottom gate structure, and the upper layer in the case of the top gate structure) may be smaller than an energy gap of the oxide semiconductor included in a layer positioned opposite to the gate electrode (that is the upper layer in the case of the bottom gate structure, and the lower layer in the case of the top gate structure). However, in a case where a difference in the energy gap between these layers is relatively small, the energy gap of the oxide semiconductor included in the layer positioned on the gate electrode side may be greater than the energy gap of the oxide semiconductor included in the layer positioned opposite to the gate electrode.

Materials, structures, and film formation methods of an amorphous oxide semiconductor and the above-described crystalline oxide semiconductors, a configuration of an oxide semiconductor layer having a layered structure, and the like are described in, for example, JP 2014-007399 A. The entire contents of the disclosure of JP 2014-007399 A are incorporated herein by reference.

The oxide semiconductor layer may include, for example, at least one metal element selected from In, Ga, and Zn. In the present embodiment, the oxide semiconductor layer includes, for example, an In—Ga—Zn—O based semiconductor (for example, an indium gallium zinc oxide). Here, the In—Ga—Zn—O based semiconductor is a ternary oxide of In (indium), Ga (gallium), and Zn (zinc), and a ratio (composition ratio) of In, Ga, and Zn is not particularly limited. For example, the ratio includes In:Ga:Zn=2:2:1, In:Ga:Zn=1:1:1, or In:Ga:Zn=1:1:2, or the like. Such an oxide semiconductor layer can be formed of an oxide semiconductor film including an In—Ga—Zn—O based semiconductor.

The In—Ga—Zn—O based semiconductor may be an amorphous semiconductor or may be a crystalline semiconductor. A crystalline In—Ga—Zn—O based semiconductor in which a c-axis is oriented substantially perpendicular to a layer surface is preferable as the crystalline In—Ga—Zn—O based semiconductor.

Note that a crystal structure of the crystalline In—Ga—Zn—O based semiconductor is disclosed in, for example, JP 2014-007399 A, JP 2012-134475 A, and JP 2014-209727 A as described above. The entire contents of the disclosure of JP 2012-134475 A and JP 2014-209727 A are incorporated herein by reference. A TFT including an In—Ga—Zn—O based semiconductor layer has a high mobility (more than 20 times as compared to an a-Si TFT) and a low leakage current (less than $\frac{1}{100}$-th as compared to the a-Si TFT). Thus, such a TFT can be suitably used as a driving TFT (for example, a TFT included in a drive circuit provided in a periphery of a display region including a plurality of pixels, and on the same substrate as the display region) and a pixel TFT (TFT provided in a pixel).

In place of the In—Ga—Zn—O based semiconductor, the oxide semiconductor layer may include another oxide semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of In (indium), Sn (tin), and Zn (zinc). Alternatively, the oxide semiconductor layer may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, CdO (cadmium oxide), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, an In—Ga—Zn—Sn—O based semiconductor, an In—W—Zn—O based semiconductor, and the like.

INDUSTRIAL APPLICABILITY

Embodiments of the present disclosure may be suitably applied to an active matrix substrate including the monolithically formed peripheral circuits. Such an active matrix substrate can be applied to various electronic devices such as a display device such as a liquid crystal display device, an organic electroluminescence (EL) display device, and an inorganic electroluminescence display device and the like, an imaging device such as an image sensor, an image input device, a fingerprint reader, and a semiconductor memory and the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An active matrix substrate having a display region including a plurality of pixel areas and a non-display region arranged around the display region, the active matrix substrate comprising:
   a substrate; and
   a plurality of oxide semiconductor TFTs supported on the substrate and provided in the display region or the non-display region, each of the plurality of oxide semiconductor TFTs includes an oxide semiconductor layer and a gate electrode arranged on a part of the oxide semiconductor layer with a gate insulating layer interposed between the oxide semiconductor layer and the gate electrode, wherein
   the oxide semiconductor layer has a first region covered with the gate electrode with the gate insulating layer interposed between the oxide semiconductor layer and the gate electrode,
   a first TFT and a second TFT are included in the plurality of oxide semiconductor TFTs,
   in the first TFT, in at least a part of the first region of the oxide semiconductor layer, a layered structure including a high mobility oxide semiconductor film having a relatively high mobility and a low mobility oxide semiconductor film arranged on the high mobility oxide semiconductor film and having a relatively lower mobility than the high mobility oxide semiconductor film is provided,
   in the second TFT, in the first region of the oxide semiconductor layer, throughout, of the high mobility oxide semiconductor film and the low mobility oxide semiconductor film, one oxide semiconductor film is provided and another oxide semiconductor film is not provided, and
   in the first region in the second TFT, the low mobility oxide semiconductor film is provided and the highest mobility oxide semiconductor film is not provided.

2. The active matrix substrate according to claim 1,
   wherein in the first region of the oxide semiconductor layer of the first TFT, another oxide semiconductor film having a lower mobility than the high mobility oxide semiconductor film between the high mobility oxide semiconductor film and the substrate is further provided, and
   in the first region of the second TFT, another oxide semiconductor film is not provided.

3. The active matrix substrate according to claim 1, the active matrix substrate further comprising:
   a plurality of pixel TFTs each arranged in the plurality of pixel areas; and
   a peripheral circuit arranged in the non-display region,
   wherein the peripheral circuit includes the first TFT, and each of the plurality of pixel TFTs is the second TFT.

4. The active matrix substrate according to claim 1, the active matrix substrate further comprising:
   a gate drive circuit and a Source Shared Driving (SSD), circuit arranged in the non-display region,
   wherein the SSD circuit includes the first TFT, and the gate drive circuit includes the second TFT.

5. The active matrix substrate according to claim 1,
   wherein in each of the plurality of pixel areas, a pixel circuit including a selection TFT, a drive TFT, and a capacitance element is provided, the selection TFT is the first TFT, and
the drive TFT is the second TFT.

6. The active matrix substrate according to claim 1, the active matrix substrate further comprising:
a plurality of pixel circuits, each of the plurality of pixel circuits is arranged in each of the plurality of pixel areas and includes a selection TFT, a drive TFT, and a capacitance element; and
a gate drive circuit arranged in the non-display region, wherein the gate drive circuit includes the first TFT, and the drive TFT is the second TFT.

7. The active matrix substrate according to claim 1, wherein each of the low mobility oxide semiconductor film and the high mobility oxide semiconductor film contains In and/or Sn, and
a sum of atomic ratios of In and Sn to all metal elements in the high mobility oxide semiconductor film is larger than a sum of atomic ratios of In and Sn to all metal elements in the low mobility oxide semiconductor film.

8. The active matrix substrate according to claim 1, wherein the high mobility oxide semiconductor film contains Sn, and the low mobility oxide semiconductor film does not contain Sn or contains Sn at a lower concentration than the high mobility oxide semiconductor film.

9. The active matrix substrate according to claim 1, wherein each of the plurality of oxide semiconductor TFTs further includes a source electrode and a drain electrode, and
the oxide semiconductor layer of each of the plurality of oxide semiconductor TFTs has a first contact region and a second contact region located on both sides of the first region, the first contact region is electrically connected to the source electrode, and the second contact region is electrically connected to the drain electrode.

10. The active matrix substrate according to claim 9, the active matrix substrate further comprising:
an interlayer insulating layer covering a plurality of the gate electrodes, a plurality of the gate insulating layers, and a plurality of the oxide semiconductor layers, in the plurality of oxide semiconductor TFTs,
wherein the source electrode and the drain electrode in each of the first TFT and the second TFT are arranged on the interlayer insulating layer.

11. The active matrix substrate according to claim 9, wherein in the first TFT, in the at least a part of the first region, the layered structure is provided, but in the first contact region and the second contact region, the low mobility oxide semiconductor film is provided and the high mobility oxide semiconductor film is not provided.

12. The active matrix substrate according to claim 11, wherein in the first TFT, in an entire first region of the oxide semiconductor layer, the layered structure is provided.

13. The active matrix substrate according to claim 11, wherein in the first TFT, in a part of the first region of the oxide semiconductor layer, the layered structure is provided, and in another part, the low mobility oxide semiconductor film is provided and the high mobility oxide semiconductor film is not provided.

14. An active matrix substrate having a display region including a plurality of pixel areas and a non-display region arranged around the display region, the active matrix substrate comprising:
a substrate; and
a plurality of oxide semiconductor TFTs supported on the substrate and provided in the display region or the non-display region, each of the plurality of oxide semiconductor TFTs includes an oxide semiconductor layer and a gate electrode arranged on a part of the oxide semiconductor layer with a gate insulating layer interposed between the oxide semiconductor layer and the gate electrode, wherein
the oxide semiconductor layer has a first region covered with the gate electrode with the gate insulating layer interposed between the oxide semiconductor layer and the gate electrode,
a first TFT and a second TFT are included in the plurality of oxide semiconductor TFTs,
in the first TFT, in at least a part of the first region of the oxide semiconductor layer, a layered structure including a high mobility oxide semiconductor film having a relatively high mobility and a low mobility oxide semiconductor film arranged on the high motility oxide semiconductor film and having, a relatively lower mobility than the high mobility oxide semiconductor film is provided,
in the second TFT, in the first region of the oxide semiconductor layer, throughout, of the high mobility oxide semiconductor film and the low mobility oxide semiconductor film, one oxide semiconductor film is provided an another oxide semiconductor film is not provided,
each of the plurality of oxide semiconductor TFTs further includes a source electrode and a gain electrode,
the oxide semiconductor layer of each of the plurality of oxide semiconductor TFTs has a first contact region and a second contact region located on both sides of the first region, the first contact region is electrically connected to the source electrode, and the second contact region is electrically connected to the drain electrode,
at least one electrode of the source electrode and the drain electrode of the second TFT is arranged on the substrate side of the oxide semiconductor layer of the second TFT with a lower insulating layer interposed between the at least one electrode and the oxide semiconductor layer,
in the first region of the second TFT, the low mobility oxide semiconductor film is provided and the high mobility oxide semiconductor film is not provided, and
in at least one of the first contact region and the second contact region in the second TFT, a layered structure including the low mobility oxide semiconductor film and a connection layer made of the high mobility oxide semiconductor film is provided, and the connection layer is electrically connected to the at least one electrode in an opening in the lower insulating layer.

15. The active matrix substrate according to claim 14, the active matrix substrate further comprising a plurality of pixel TFTs each arranged in the plurality of pixel areas,
wherein each of the plurality of pixel TFTs is the second TFT,
the at least one electrode is the source electrode of the second TFT, and
the drain electrode of the second TFT is arranged above the oxide semiconductor layer of the second TFT.

16. The active matrix substrate according to claim 14, wherein each of the low mobility oxide semiconductor film and the high mobility oxide semiconductor film contains In and/or Sn, and
a sum of atomic ratios of In and Sn to all metal elements in the high mobility oxide semiconductor film is larger than a sum of atomic ratios of In and Sn to all metal elements in the low mobility oxide semiconductor film.

17. The active matrix substrate according to claim 14, wherein the high mobility oxide semiconductor film contains Sn, and the low mobility oxide semiconductor film does not contain Sn or contains Sn at a lower concentration than the high mobility oxide semiconductor film.

18. An active matrix substrate having a display region including a plurality of pixel areas and a non-display region arranged around the display region, the active matrix substrate comprising:
a substrate; and
a plurality of oxide semiconductor TFTs supported on the substrate and provided in the display region or the non-display region, each of the plurality of oxide semiconductor TFTs includes an oxide semiconductor layer and a gate electrode arranged on a part of the oxide semiconductor layer with a gate insulating layer interposed between the oxide semiconductor layer and the gate electrode, wherein
the oxide semiconductor layer has a first region covered with the gate electrode with the gate insulating layer interposed between the oxide semiconductor layer and the gate electrode,
a first TFT and a second TFT are included in the plurality of oxide semiconductor TFTs,
in the first TFT, in at least a part of the first region of the oxide semiconductor layer, a layered structure including a high mobility oxide semiconductor film having a relatively high mobility and a low mobility oxide semiconductor film arranged on the high mobility oxide semiconductor film end having a relatively lower mobility than the high mobility oxide semiconductor film is provided,
in the second TFT, in the first region of the oxide semiconductor layer, throughout, of the high mobility oxide semiconductor film and the low mobility oxide semiconductor film, one oxide semiconductor film is provided and another oxide semiconductor film is not provided,
each of the plurality of oxide semiconductor TFTs further includes a source electrode and a drain electrode,
the oxide semiconductor layer of each of the plurality of oxide semiconductor TFTs has a first contact region and a second contact region located on both sides of the first region, the first contact region is electrically connected to the source electrode, and the second contact region is electric connected to the drain electrode,
a third TFT is further included in the plurality of oxide semiconductor TFTs,
in the first TFT, in each of the first region, the first contact region, and the second contact region, the layered structure is provided, and
in the third TFT, in the at least a part of the first region, the layered structure is provided, but in each of the first contact region and the second contact region, the low mobility oxide semiconductor film is provided and the high mobility oxide semiconductor film is not provided.

19. The active matrix substrate according to claim 18, wherein each of the low mobility oxide semiconductor film and the high mobility oxide semiconductor film contains In and/or Sn, and
a sum of atomic ratios of In and Sn to all metal elements in the high mobility oxide semiconductor film is larger than a sum of atomic ratios of In and Sn to all metal elements in the low mobility oxide semiconductor film.

20. The active matrix substrate according to claim 18, wherein the high mobility oxide semiconductor film contains Sn, and the low mobility oxide semiconductor film does not contain Sn or contains Sn at a lower concentration than the high mobility oxide semiconductor film.

* * * * *